US012751052B2

United States Patent

(12) United States Patent
Gibson

(10) Patent No.: US 12,751,052 B2
(45) Date of Patent: Sep. 29, 2026

(54) ELECTRONIC COMPONENTS EMPLOYING FIELD IONIZATION

(71) Applicant: Psiquantum, Corp., Palo Alto, CA (US)

(72) Inventor: Gary Gibson, Palo Alto, CA (US)

(73) Assignee: Psiquantum, Corp., Palo Alto, CA (US)

( * ) Notice: Subject to any disclaimer, the term of this patent is extended or adjusted under 35 U.S.C. 154(b) by 849 days.

(21) Appl. No.: 18/281,544

(22) PCT Filed: Oct. 27, 2020

(86) PCT No.: PCT/US2020/057566
§ 371 (c)(1),
(2) Date: Sep. 11, 2023

(87) PCT Pub. No.: WO2021/086871
PCT Pub. Date: May 6, 2021

(65) Prior Publication Data

US 2024/0322019 A1 Sep. 26, 2024

Related U.S. Application Data

(60) Provisional application No. 62/926,976, filed on Oct. 28, 2019.

(51) Int. Cl.
*H10D 48/34* (2025.01)
*H10D 62/10* (2025.01)
(Continued)

(52) U.S. Cl.
CPC ......... *H10D 48/341* (2025.01); *H10D 62/106* (2025.01); *H10W 40/305* (2026.01); *H10D 10/231* (2025.01)

(58) Field of Classification Search
CPC .......... H10D 48/362; H10D 8/00; H10D 8/60; H10D 62/106; H10D 48/341; H10D 10/231; H10W 40/305
See application file for complete search history.

(56) References Cited

U.S. PATENT DOCUMENTS 3,519,894 A 7/1970 Hall
4,472,727 A 9/1984 Tewksbury
(Continued)

FOREIGN PATENT DOCUMENTS

JP 5863168 A 4/1983
JP 6049667 A 3/1985
(Continued)

OTHER PUBLICATIONS

CA3,159,105, "Office Action", Dec. 5, 2025, 3 pages.
(Continued)

*Primary Examiner* — Wasiul Haider
(74) *Attorney, Agent, or Firm* — Kilpatrick Townsend & Stockton LLP

(57) ABSTRACT

A diode includes a first contact comprising a cathode. The diode also includes a field ionized, doped semiconductor region electrically coupled to the first contact. The diode further includes a second contact comprising an anode. The second contact is electrically coupled to the field ionized, doped semiconductor region. The first contact can be a first ohmic contact region electrically coupled to a first portion of the field ionized, doped semiconductor region and the second contact can be a second ohmic contact region electrically coupled to a second portion of the field ionized, doped semiconductor region.

12 Claims, 14 Drawing Sheets

(51) Int. Cl.
*H10W 40/30* (2026.01)
*H10D 10/00* (2025.01)

(56) References Cited

U.S. PATENT DOCUMENTS

| | | | | |
|---|---|---|---|---|
| 8,814,622 | B1 * | 8/2014 | Resnick | H01J 1/3044 445/51 |
| 10,439,075 | B1 * | 10/2019 | Quddus | H10D 84/811 |
| 2011/0017991 | A1 | 1/2011 | Tanimoto et al. | |
| 2015/0060876 | A1 * | 3/2015 | Xing | H10D 30/477 257/76 |
| 2016/0028403 | A1 | 1/2016 | Mccaughan et al. | |
| 2016/0290868 | A1 | 10/2016 | Gunnarsson et al. | |
| 2016/0343881 | A1 * | 11/2016 | Pang | H10D 8/60 |
| 2018/0102470 | A1 | 4/2018 | Das et al. | |
| 2019/0148593 | A1 * | 5/2019 | Islam | H10H 20/013 257/13 |

FOREIGN PATENT DOCUMENTS

| | | | |
|---|---|---|---|
| JP | 6126266 | A | 2/1986 |
| JP | 0541527 | A | 2/1993 |
| JP | 09172172 | A | 6/1997 |
| JP | 2004327777 | A | 11/2004 |
| JP | 2006059897 | A | 3/2006 |
| JP | 2008027945 | A | 2/2008 |
| JP | 2009260278 | A | 11/2009 |
| WO | 8700692 | A1 | 1/1987 |

OTHER PUBLICATIONS

CN202080084984.X, "Office Action", Aug. 26, 2025, 8 pages.
KR10-2022-7017973, "Office Action", Aug. 24, 2025, 4 pages.
KR10-2025-7004995, "Office Action", Sep. 29, 2025, 7 pages.
Foty, "Impurity Ionization in MOSFETs at Very Low Temperatures", Cryogenics, vol. 30, No. 12, Dec. 1990, pp. 1056-1063.
JP2022-525015, "Office Action", Oct. 18, 2024, 22 pages.
EP20881769.2, "Extended European Search Report", Oct. 20, 2023, 11 pages.
Martino, et al., "Transient Effects in Accumulation Mode p-Channel SOI MOSFET' s Operating at 77 K", Institute of Electrical and Electronics Engineers Transactions on Electron Devices, vol. 41, No. 4, Apr. 1, 1994, pp. 519-523.
CN202080084984.X, "Office Action", Jan. 27, 2025, 11 pages.
KR10-2022-7017973, "Office Action", Dec. 16, 2024, 6 pages.
PCT/US2020/057566, "International Preliminary Report on Patentability", May 12, 2022, 9 pages.
PCT/US2020/057566, "International Search Report and Written Opinion", Feb. 9, 2021, 13 pages.
CN202080084984.X, "Office Action", Jan. 24, 2026, 9 pages.
JP2022-525015, "Office Action", Feb. 10, 2026, 13 pages.
CN202080084984.X, "Office Action", Jun. 18, 2026, 10 pages.
EP20881769.2, "Office Action", Jul. 15, 2026, 7 pages.
KR10-2022-7017973, "Notice of Decision to Grant", Jul. 18, 2026, 5 pages.

* cited by examiner

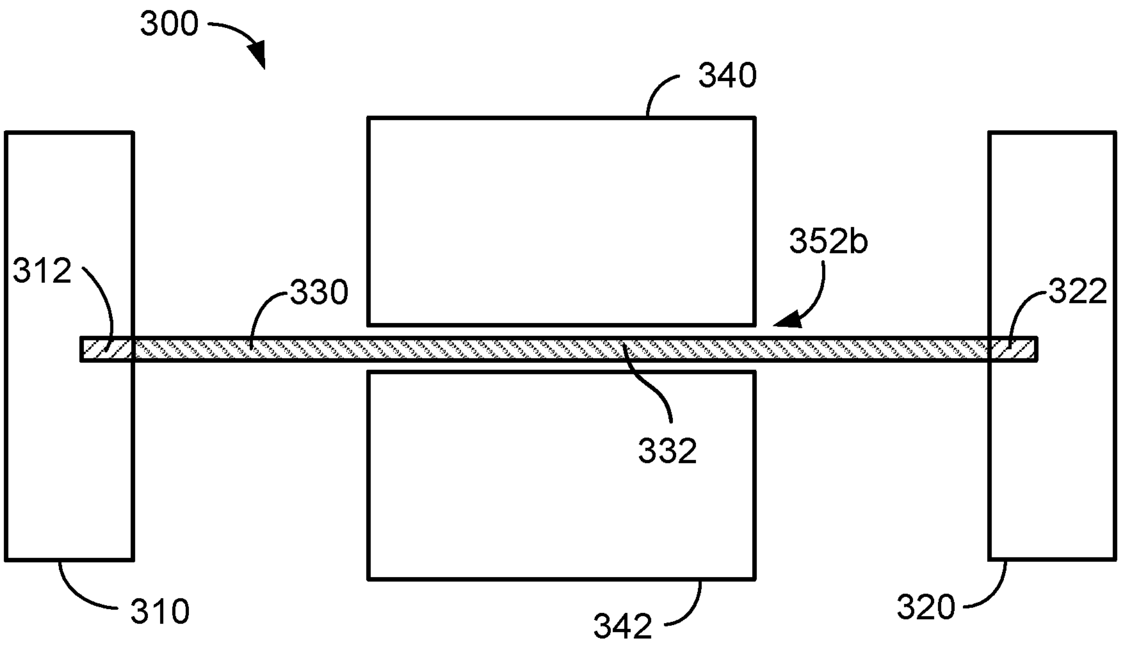
FIG. 3A
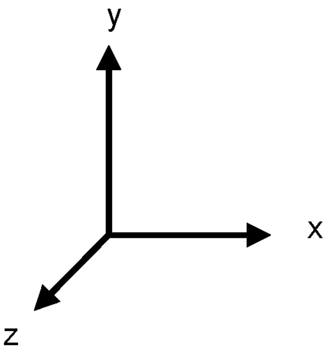

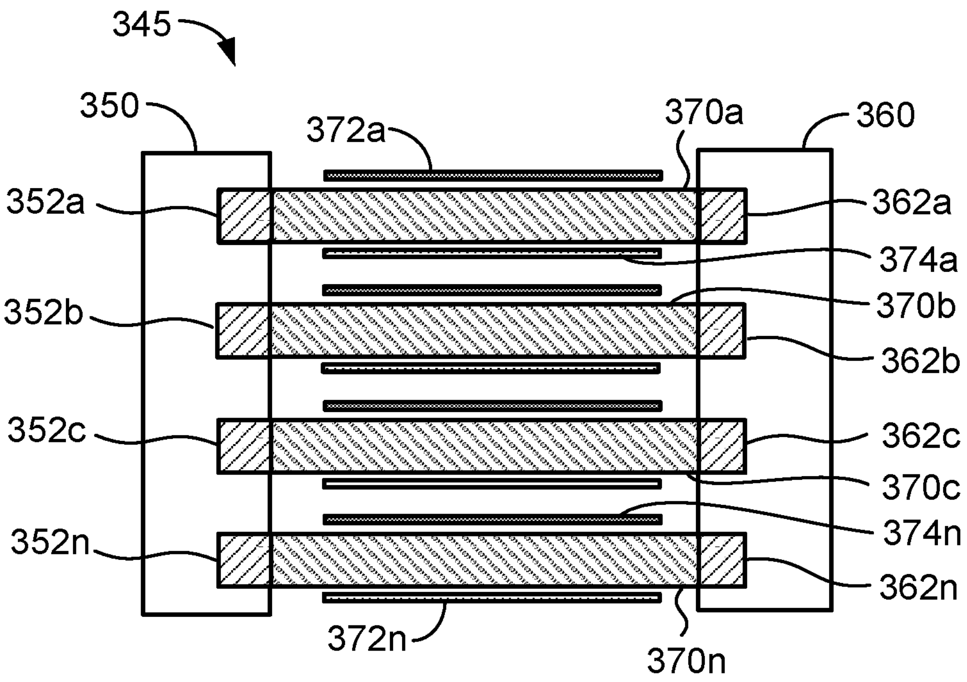
FIG. 3B
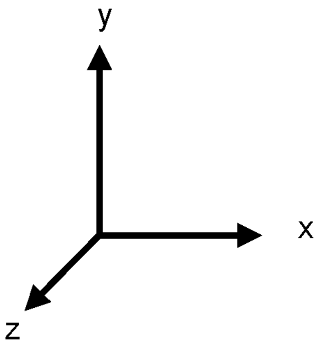

ELECTRONIC COMPONENTS EMPLOYING FIELD IONIZATION

CROSS-REFERENCES TO RELATED APPLICATIONS

This application claims priority to U.S. Provisional Patent Application No. 62/926,976 filed on Oct. 28, 2019, entitled “Electronic Components Employing Field Ionization,” the disclosure of which is hereby incorporated by reference in its entirety for all purposes.

BACKGROUND OF THE INVENTION

Doped semiconductor structures have been widely used in semiconductor devices. A variety of techniques, including ion implantation and diffusion processes, have been utilized to introduce dopants into intrinsic semiconductor materials. As the temperature of the doped semiconductor device is varied, the fraction of ionized dopants, and the resulting carrier density, in the semiconductor device vary with temperature. At low temperatures, i.e., below the activation temperature of the particular dopants, the ionization of dopants may not be sufficient to produce the number of carriers needed for device operation. This lack of carriers at low temperature has been referred to as carrier “freeze-out.”

Therefore, operation at cryogenic temperatures may result in poor performance for conventional semiconductor devices. Accordingly, there is a need in the art for improved methods and systems related to the design and operation of diodes and transistors at cryogenic temperatures.

SUMMARY OF THE INVENTION

Embodiments of the present invention utilize field ionization to effect semiconductor device operation. The field ionization reverses, on command, the low temperature freeze out of dopants that, in conventional devices, can impair device performance at low temperatures. Utilizing this field ionization technique, a variety of non-linear electrical components, including bipolar “diodes” and “transistors” are implemented as described more fully herein.

In some embodiments, diodes and/or transistors are provided that not only enable performance (in a variety of device architectures, including conventional CMOS circuits) commonly associated with high temperature (e.g., room temperature) operation at low temperatures, but can provide benefits operating at low temperatures (e.g., cryogenic temperatures) including operation at lower electric fields or biases and providing larger sub-threshold slopes, or the like, than conventional devices.

The inventor has determined that there is an increasing need for low temperature electronics that support applications in quantum computing, quantum cryptography, and quantum communication, as well as other fields. To address these and other needs, embodiments of the present invention provide novel device structures and methods of operation that perform the functions normally served by diodes and transistors in cryogenic electronics, but with advantages in terms of performance and structural simplicity.

Presently, conventional CMOS circuitry is relied upon for low temperature electronics. However, the performance characteristics of conventional CMOS diodes and transistors are limited at cryogenic temperatures in terms of on-off resistance ratios and the power and bias required to operate them. Accordingly, CMOS circuitry and p-n junctions can be replaced or supplemented using the structures based on field ionization described herein. As described herein, embodiments of the present invention provide devices that can include device architectures having less complexity, for example, a single semiconductor region with a single doping level, than conventional devices. Moreover, embodiments of the present invention can be designed such that the threshold in the I-V curve occurs at low bias, if appropriate to the particular application.

Numerous benefits are achieved by way of the present invention over conventional techniques. For example, embodiments of the present invention provide both “diodes” and “transistors” that can be bipolar. Utilizing embodiments of the present invention, very large on/off ratios are possible. Moreover, the current levels, bias voltages, and on/off ratio can be engineered through the choice of geometry and/or doping level for the semiconductor devices. In some embodiments, the transistor threshold voltage can be low and is not limited by bandgap, which is a characteristic limitation of conventional transistors.

Furthermore, very large gains can be achieved for transistors that are fabricated and operated as described herein. The operating temperatures (e.g., a range of operating temperatures, including, potentially, room temperature) of both the diodes and transistors described herein can be engineered by using, for example, appropriate dopants and host materials. Because of the utilization of field ionization techniques, devices provided according to embodiments of the present invention can operate at very low power (e.g., through use of low doping density materials with appropriate lengths and widths), particularly since reliance on self-heating utilized in superconducting gain elements is not needed in some embodiments. Moreover, devices described herein can operate at very low biases (e.g., by using small dimensions or easily ionized dopants) and can be characterized by high operation frequencies while utilizing simple designs that are CMOS compatible. These and other embodiments of the invention along with many of its advantages and features are described in more detail in conjunction with the text below and attached figures.

Embodiments of the present invention, both in diode and/or transistor form are suitable for use in electronic circuits operated, for example, at cryogenic temperatures. In particular, the electronics described herein are suitable for use in quantum computing at cryogenic temperatures. As an example, logic elements utilizing diodes and/or transistors provided by embodiments of the present invention are useful in conjunction with a superconducting nanowire single photon detector (SNSPD) with an integrated heating element that is electrically isolated, but thermally coupled to the superconducting nanowire. A cryogenic bipolar diode can be utilized to switch the integrated heating element off or on, which, in turn, causes the superconducting nanowire to switch from a superconducting to a non-superconducting state. Moreover, a cryogenic field-ionization-based transistor could also be useful for direct amplification of the signal from an SNSPD.

The following detailed description, together with accompanying drawings, will provide a better understanding of the nature and advantages of the claimed invention.

BRIEF DESCRIPTION OF THE DRAWINGS

FIG. 3A is a simplified plan view schematic diagram illustrating a cryogenic bipolar transistor according to an embodiment of the present invention.

FIG. 3B is a simplified plan view schematic diagram illustrating a plurality of cryogenic bipolar transistors in parallel according to an embodiment of the present invention.

DETAILED DESCRIPTION OF SPECIFIC EMBODIMENTS

Figure 1A:
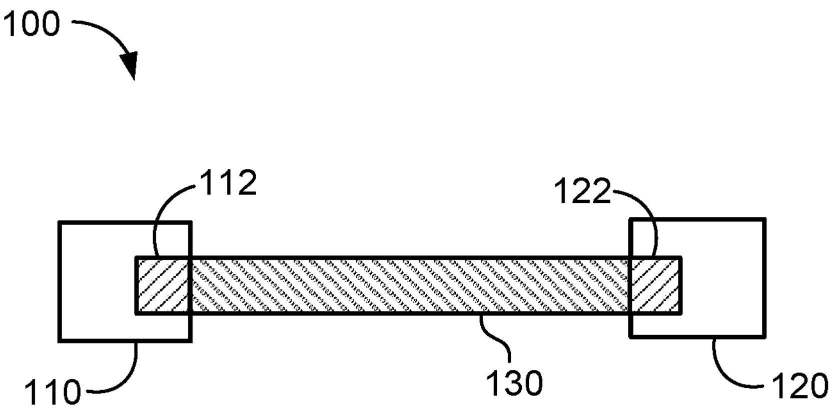
FIG. 1A is a simplified schematic diagram of a cryogenic bipolar diode according to an embodiment of the present invention.

According to embodiments of the present invention, the field ionization is utilized to affect diode and transistor operation. As an example, a carrier-based bipolar diode is provided that provides bipolar, highly non-linear electrical functionality at low (e.g., cryogenic) temperatures using carrier freeze out and field ionization principles. As another example, a majority carrier bipolar transistor is provided that provides transistor functionality at low (e.g., cryogenic) temperatures using carriers generated using field ionization. In other embodiments, these devices operate at temperatures up to and exceeding room temperature.

As the temperature of a doped semiconductor is decreased, the dopants will "freeze out," i.e., they will become neutral (un-ionized) and the carrier concentration, also referred to as carrier density, in the semiconductor will drop dramatically. This occurs when kT becomes low relative to the dopant ionization energy, where k is Boltzmann's constant and T is the temperature. As an example, the ionization energies for dilute boron (a p-type dopant), phosphorus, antimony, and arsenic (n-type dopants) in silicon are 45, 45, 39, and 49 meV, respectively. These ionization energies can lead to significant carrier freeze out even at liquid nitrogen temperatures, resulting in the doped semiconductor material becoming insulating. At high dopant concentrations, the effective ionization energies decrease due to clustering of dopants (see, for example, Altermatt et al., *Journal of Applied Physics* 100, 113714 (2006)). Thus, the degree of dopant freeze out and its dependence on temperature are a function of dopant density. The distribution of the dopants can be characterized by a dopant profile, also referred to as a doping profile, that characterizes the dopant concentration as a function of position. Thus, distribution of dopants can be understood as the dopant concentration as a function of position.

Dopants that are frozen out can be ionized by an electric field. For shallow dopants at low temperature, the ionization can occur primarily via quantum mechanical tunneling of the carrier out of (or into) the potential well created by a dopant ion. The height and width of the potential barrier that a carrier must tunnel through are lowered by the application of an electric field, thereby greatly increasing the tunneling probability. At higher temperature, carriers can escape the ionic potential mainly via a thermally-activated Poole-Frenkel process whereby they are thermally excited over the potential barrier surrounding the dopant ion. Here again, the height of the barrier they must be excited over is decreased by application of the electric field. That is, the activation energy of the dopant ions is lowered by an electric field. Moreover, in some embodiments, impact ionization of dopants can assist the field ionization process as current flow can result in impact ionization of dopants that have been frozen out and not yet field ionized. Moreover, thermal activation by a phonon can energize a dopant to a level below the activation energy and cooperate with either tunneling or Poole-Frenkel processes to provide thermally-assisted field ionization in a two-step process. Additional description related to ionization via the Poole-Frenkel process, and prediction of tunneling rates for the tunneling process, is provided in Foty, *Cryogenics* 30, 1056 (1990).

In general, the electric field required to ionize a dopant atom will depend on the dopant atom, the dopant atom concentration, and the host material. A donor or acceptor ion in a semiconductor can be thought of as creating a trap level that can either be occupied or unoccupied. The trap levels created by typical dopant atoms in silicon, such as boron (acceptor), arsenic (donor), or phosphorus (donor), are mostly unoccupied at room temperature. In other words, they have contributed a carrier to the relevant band (donors contribute an electron to the conduction band and acceptors contribute a hole to the valence band). This is because kT is ~25 meV at room temperature, which is comparable to the activation energies for these dopants (~45 meV in silicon as discussed above). At room temperature, the vast majority of charge carriers in silicon come from intentionally introduced dopant atoms. This is because the intrinsic carrier concentration in Si at room temperature is only $\sim 10^{10}$ $cm^{-3}$.

The field-ionization based transistors and diodes provided by embodiments of the present invention rely on the dopant atoms "freezing out" at low temperature in the absence of an applied field. In other words, these devices operate at a temperature that is low enough to lower the carrier concentration by causing most of the carriers to remain in the traps. The following discusses the relationship between the operating temperature and the activation energy for the dopant. This discussion is focused on donors and electrons, but the analysis is also applicable to acceptors/holes.

For a trap in thermal equilibrium with a reservoir of fermions:

$$f = \frac{1}{1 + \frac{1}{g} e^{\frac{E_{trap} - E_F}{kT}}} \left(\textit{Fermi–Dirac}\text{ statistics}\right) \tag{1}$$

where f=probability of a trap being occupied (the 'ionization fraction'), $E_{trap}$=trap energy level; $E_F$=reservoir Fermi level; g=level degeneracy.

In the devices described herein, the reservoir of fermions is simply the collection of electrons (or holes) in the semiconductor.

At zero field, the electron density can be expressed as:

$$n = N_C(t) e^{\frac{E_F - E_C}{kT}} \ (\textit{Boltzmann}\text{ statistics}) \tag{2}$$

where $N_C(T)$ is the band-edge density of states and $E_C$ is the energy of the conduction band edge. It will be appreciated that the use of Boltzmann statistics is appropriate for embodiments of the present invention since $$\frac{E_F - E_C}{kT} \gg 1.$$

Combining these equations yields:

$$f = \frac{1}{1 + \frac{N_c(T)}{gn} e^{\frac{-E_A}{kT}}} \tag{3}$$

where $N_c(T)$ is the conduction band edge density of states (which has some temperature dependence) and $E_A = E_C - E_{trap}$ is the activation energy for the dopant. Because essentially all of the carriers come from ionization of the dopants, $$f \cong \frac{n}{N_{dop}} \tag{4}$$

where $N_{dop}$ is the density of dopant atoms. Therefore, $$\frac{n}{N_{dop}} = \frac{1}{1 + \frac{N_c(T)}{gn} e^{\frac{-E_A}{kT}}}. \tag{5}$$

$N_c(T)$, $E_A$, g are all known for standard materials such as silicon and its common dopants, so this equation can be solved for n in terms of $E_A$ and T, which is the temperature utilized to "freeze-out" a substantial fraction of the carriers for a given activation energy. Typically, kT is less than or on the order of $E_A$. In designing devices described herein, the device performance metrics will be specified, for example, an on/off ratio for a transistor, and given device characteristics, for example, mobility as a function of temperature, the number or concentration of dopants that need to be frozen out in the absence of an applied field can be determined, and the desired dopant density can be calculated.

Thus, the device performance will depend on the dopant(s), the host material, the dopant concentration, the operating temperature, the range of current densities during operation, and the device structure. Although some embodiments are described in terms of cryogenic operation, for example, operation at ~4K, ~10K, and up to ~30K, embodiments of the present invention are not limited to these particular temperatures. In other implementations, the devices can be operated at higher temperatures, for instance 77K or higher, for example, up to room temperature, by selecting deeper level dopants with higher activation energies, lower dopant concentrations, and the like. As will be evident to one of skill in the art, the operating temperature will be a function of the application for the device structure (e.g., diode, transistor, or the like), the on/off ratio, which is driven by the ratio of the carrier concentration with/without applied bias, carrier mobility as a function of temperature, and the like.

The fraction of carriers (or dopants) that will be frozen at zero applied field in devices described herein will be a function of the device characteristics and the intended application. In an embodiment, the vast majority of the carriers are frozen out in the absence of an applied field (much greater than 99%), enabling high levels of device operation. In other implementations, the number of carriers frozen out will vary, for example, only 90%, or even 50%, depending on the particular application.

In applications that benefit from a higher on-off ratio, the dopant levels in the doped semiconductor region can utilize lower doping concentrations, for example, $\sim 1 \times 10^{16}$ $cm^{-3}$ or $\sim 1 \times 10^{17}$ $cm^{-3}$. Alternatively, for applications that benefit from higher current density, the dopant levels in the doped semiconductor region can utilize higher doping concentrations, for example, $\sim 1 \times 10^{18}$ $cm^{-3}$.

FIG. 1A is a simplified schematic diagram of a cryogenic bipolar diode according to an embodiment of the present invention. Cryogenic bipolar diode 100 includes two contact pads, contact pad 110 and contact pad 120, that are electrically connected to doped semiconductor region 130. In order to make ohmic contact to doped semiconductor region 130, an ohmic contact region 112 is utilized in conjunction with contact pad 110 and another ohmic contact region 122 is utilized in conjunction with contact pad 120. These ohmic contact regions can be highly doped semiconductor regions, silicide, or the like.

Referring to FIG. 1A, doped semiconductor region 130 can be defined as a patterned rectangular strip as illustrated in FIG. 1A or in other geometries. As an example, doped semiconductor region 130 can be a patterned strip of silicon on insulator (SOI) doped with boron, phosphorus, or arsenic, contacted at each end by ohmic contact regions 112 and 122. The doped semiconductor region 130 can be doped either p-type or n-type depending on the application and the materials from which the doped semiconductor region and the dopant are selected such that, as described above, the dopant ions freeze out near a desired operating temperature in the absence of an applied electric field. In other words, at the operating temperature, the Fermi level of the semiconductor is either close to the dopant level or lies between the dopant level and the corresponding band edge (i.e., conduction band for n-type, valence band for p-type). Thus, without a sufficiently strong electric field, a substantial fraction of the dopant atoms remain neutral and the carrier concentration in the semiconductor is low, resulting in high resistivity in the doped semiconductor region.

In contrast with conventional doped materials supporting current flow, the cryogenic bipolar diode 100 is characterized by non-linear behavior as the carrier concentration is modified in response to the applied voltage bias, resulting in a non-linear current vs. applied voltage bias relationship.

In some embodiments, in order to provide a unipolar diode, one of the contact pads 110 or 120 could be a rectifying contact. In this implementation, current flow in a single direction could be implemented in order to provide conventional unipolar diode functionality.

It will be appreciated that the cryogenic bipolar diode 100 illustrated in FIG. 1A is capable of symmetric operation. That is, either contact pad 110 or contact pad 120 can serve as the anode or the cathode of the diode. Accordingly, if contact pad 110 is biased at a positive voltage with respect to contact pad 120, current flow will be from contact pad 110 acting as the cathode to contact pad 120 acting as the anode. Alternatively, if contact pad 120 is biased at a positive voltage with respect to contact pad 110, current flow will be from contact pad 120 acting as the cathode to contact pad 110 acting as the anode. Thus, the field ionization to generate a predetermined carrier concentration in the doped semiconductor region 130 enables bipolar operation of the diode in a symmetric manner depending on the operating voltages. As the width of doped semiconductor region 130 increases, the ability to carry additional current as the carrier concentration increases as a result of field ionization increases proportionally.

Figure 1B:
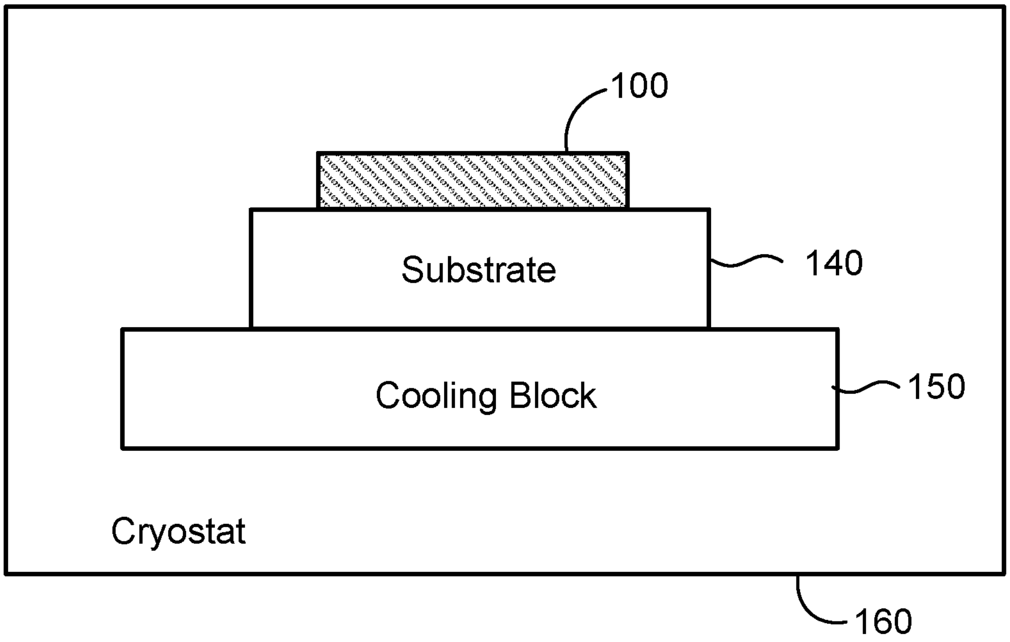
FIG. 1B is a simplified schematic diagram illustrating the cryogenic bipolar diode shown in FIG. 1A disposed in a cryostat according to an embodiment of the present invention.

FIG. 1B is a simplified schematic diagram illustrating the cryogenic bipolar diode shown in FIG. 1A disposed in a cryostat according to an embodiment of the present invention. As illustrated in FIG. 1B, cryogenic bipolar diode 100 is supported by substrate 140, which supports cryogenic bipolar diode 100. Cooling block 150 is thermally coupled to substrate 140 and both substrate 140 and cooling block 150 are disposed in cryostat 160. Thus, using the embodiment illustrated in FIG. 1B, cryogenic bipolar diode 100 can be operated at cryogenic temperatures as described more fully herein.

Figure 2A:
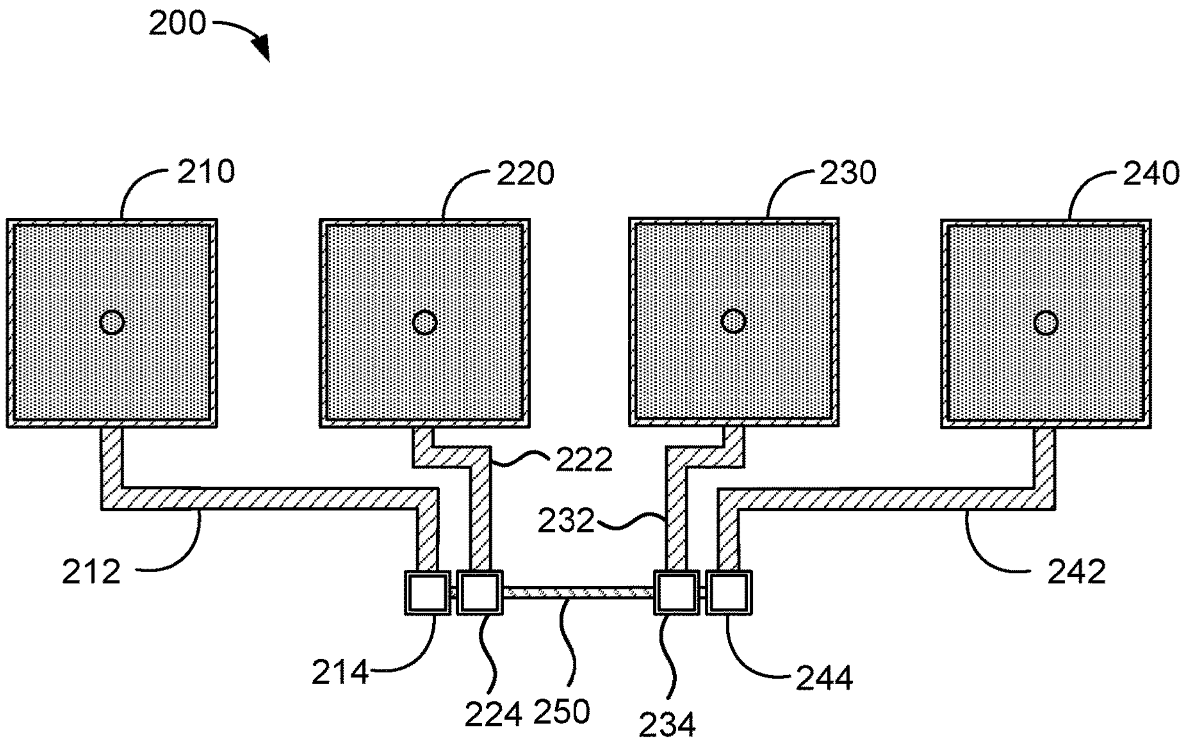
FIG. 2A is a simplified schematic plan view diagram of a cryogenic bipolar diode with measurement electrodes according to an embodiment of the present invention.

FIG. 2A is a simplified schematic plan view diagram of a cryogenic bipolar diode with measurement electrodes according to an embodiment of the present invention. As described more fully below, field ionization of carriers that results as the carrier freeze out phenomenon is reversed, can be used to produce a highly non-linear, bipolar, "diode-like" current-voltage (I-V) characteristic.

The cryogenic bipolar diode illustrated in FIG. 2A is able to operate in a bipolar manner, with either first contact 214 or second contact 244 functioning as the anode and either second contact 244 or first contact 214, respectively, functioning as the cathode. In contrast with conventional unipolar diodes, for example, a p-n junction diode that exhibits forward bias operation in response to an applied bias and reverse bias operation in response to the opposite applied bias, embodiments of the present invention provide bipolar operation in response to the ionization of carriers that were initially frozen into the dopant ions as a result of the cryogenic temperature of operation.

As illustrated in FIG. 2A, four contacts or terminals are utilized, two outer contacts for applying a voltage bias to the structure (and the resulting field ionization) and two inner contacts, which can be referred to as measurement electrodes, for measuring the resulting voltage. Referring to FIG. 2A, contact 214 and contact 244 are utilized to apply a voltage bias across the doped semiconductor region 250. Since contacts 214 and 244 may be characterized by a finite contact resistance, measurement electrode 224 and measurement electrode 234 are utilized to measure the voltage present at the locations where the contacts are in electrical contact with the doped semiconductor region. In order to provide the voltage bias at contacts 214 and 244, external contacts 210 and 240 are utilized, respectively, along with lead lines 212 and 242, respectively. Measurement of the voltage present at measurement electrodes 224 and 234 is facilitated using external contacts 220 and 230, respectively, along with lead lines 222 and 232, respectively, through which the current flow is low, enabling accurate voltage measurement.

Depending on the operating temperature of the cryogenic bipolar diode and the desired range of current densities, the doping level utilized in the doped semiconductor structure will vary according to the particular application. For example, different dopants (e.g., boron, phosphorus, arsenic, antimony, and gallium, combinations thereof, or the like) can be utilized as well as different doping levels (e.g., ranging from about $1\times10^{15}$ to about $5\times10^{18}$) can be utilized.

Figure 2B:
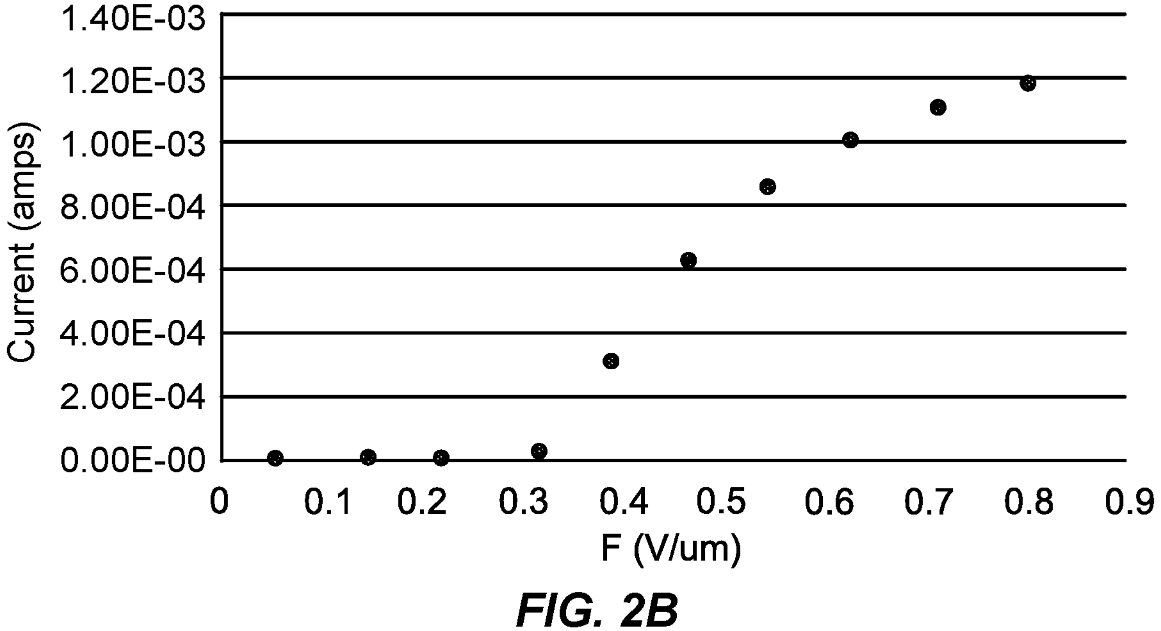
FIG. 2B is a plot illustrating current vs. applied electric field for a cryogenic bipolar diode according to an embodiment of the present invention.

FIG. 2B is a plot illustrating current vs. applied electric field for a cryogenic bipolar diode according to an embodiment of the present invention. In FIG. 2B, a four terminal device similar to that illustrated in FIG. 2A, with a doped semiconductor region of silicon doped to $7.2\times10^{17}$ $cm^{-3}$ with boron, was measured at 4.2K. Current was driven through the outer contacts and the resulting potential was measured on the inner contacts.

The current-voltage (I-V) characteristic shows highly non-linear behavior, with negligible current before an applied field of 0.3 V/μm, and an increase in current flow for applied fields higher than this applied field. As discussed above, impact ionization of dopants, as current begins to flow, can result in additional increases in conductivity to supplement the field ionization processes described herein. Thus, some implementations can utilize impact ionization as a form of field ionization as the current interacting with the dopants is driven by the applied electric field. As discussed more fully in relation to FIG. 2D below, the resistance per unit length as a function of applied electric field for a cryogenic bipolar diode demonstrates a threshold behavior in which the resistance per unit length vs. applied electric field is characterized by a first slope on a log-log plot (e.g., substantially zero) for a range of applied electric fields. Then, as the carrier concentration increases as a result of field ionization, the resistance per unit length vs. applied electric field is characterized by a second slope on a log-log plot, with the resistance per unit length decreasing with increasing applied electric field. Operation in the region characterized by this second slope, which can be considered as operation through a threshold and/or above a threshold, can reduce the resistance per unit several orders of magnitude in response to the field ionization-produced increase in carrier concentration. One of ordinary skill in the art would recognize many variations, modifications, and alternatives.

Figure 2C:
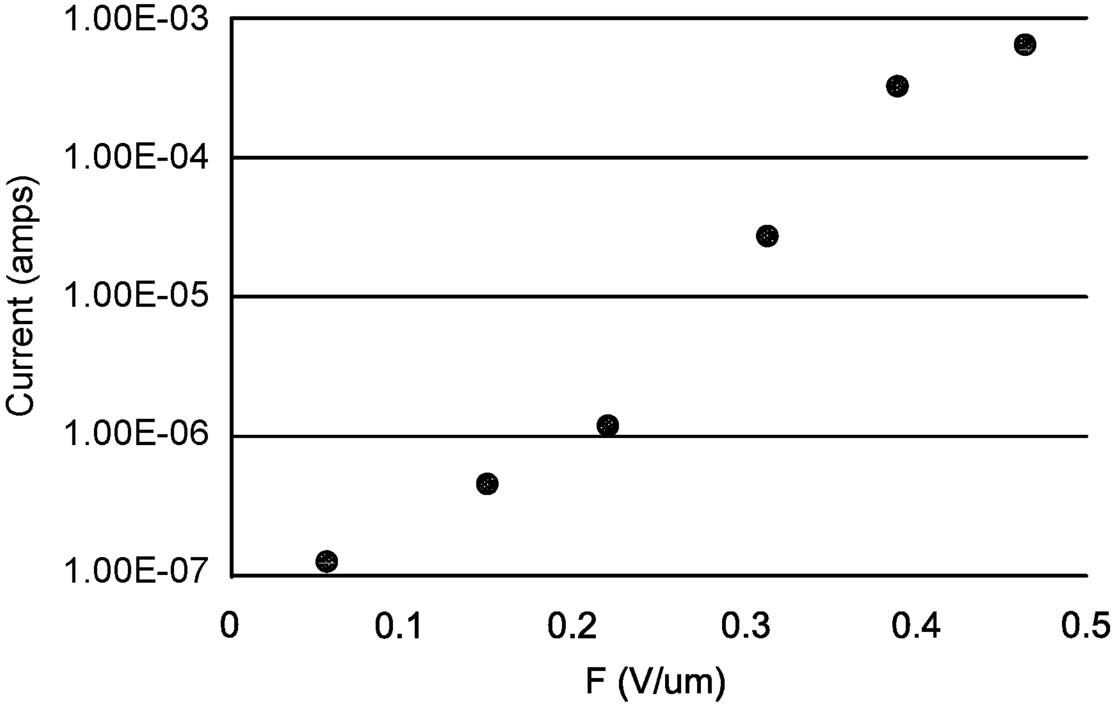
FIG. 2C is a plot showing a range of the data shown in FIG. 2B.

FIG. 2C is a plot showing a range of the data shown in FIG. 2B. In FIG. 2C, the I-V data is plotted as a semi-log plot, with the current axis in log increments and the applied field axis in linear increments. At an electric field of ~0.1 V/μm the dopants ions begin to field ionize. This field ionization results in an inverse slope of ~70 mV/decade for this 15 μm long device, which is comparable to conventional silicon p-n junction diodes operated at room temperature. However, this inverse slope should scale approximately linearly with device length so that devices with lengths of 1.5 μm are predicted to have inverse slopes ~7 mV/decade, with shorter devices performing even better. This would exceed the demonstrated performance of standard silicon p-n junctions even at cryogenic temperatures. It should be noted that in the device illustrated in FIG. 2A, this slope is achieved over a current range that exceeds three decades. Moreover, in some embodiments, for example short devices and devices having shallow dopant activation energies, steeper or higher slopes are possible as a result of field ionization.

As illustrated in FIG. 2C, the current increase is substantially exponential as a function of applied field, which is to be expected as field ionization produces a substantially exponential increase in majority carriers as a function of applied field. It should be noted that the rate of increase of carriers with field is not strictly exponential and the functional relationship depends on a number of factors, including the particular field ionization mechanism that dominates the operation. Thus, although some embodiments demonstrate substantially exponential increases in current, the present invention is not limited to this functional relationship. According to embodiments of the present invention, the on-off resistance ratio of devices described herein can be up to or greater than seven decades. This large range is a far larger on-off ratio than can be achieved with conventional p-n junctions, which will break down prior to reaching current densities seven orders of magnitude above their forward threshold current density.)

Figure 2D:
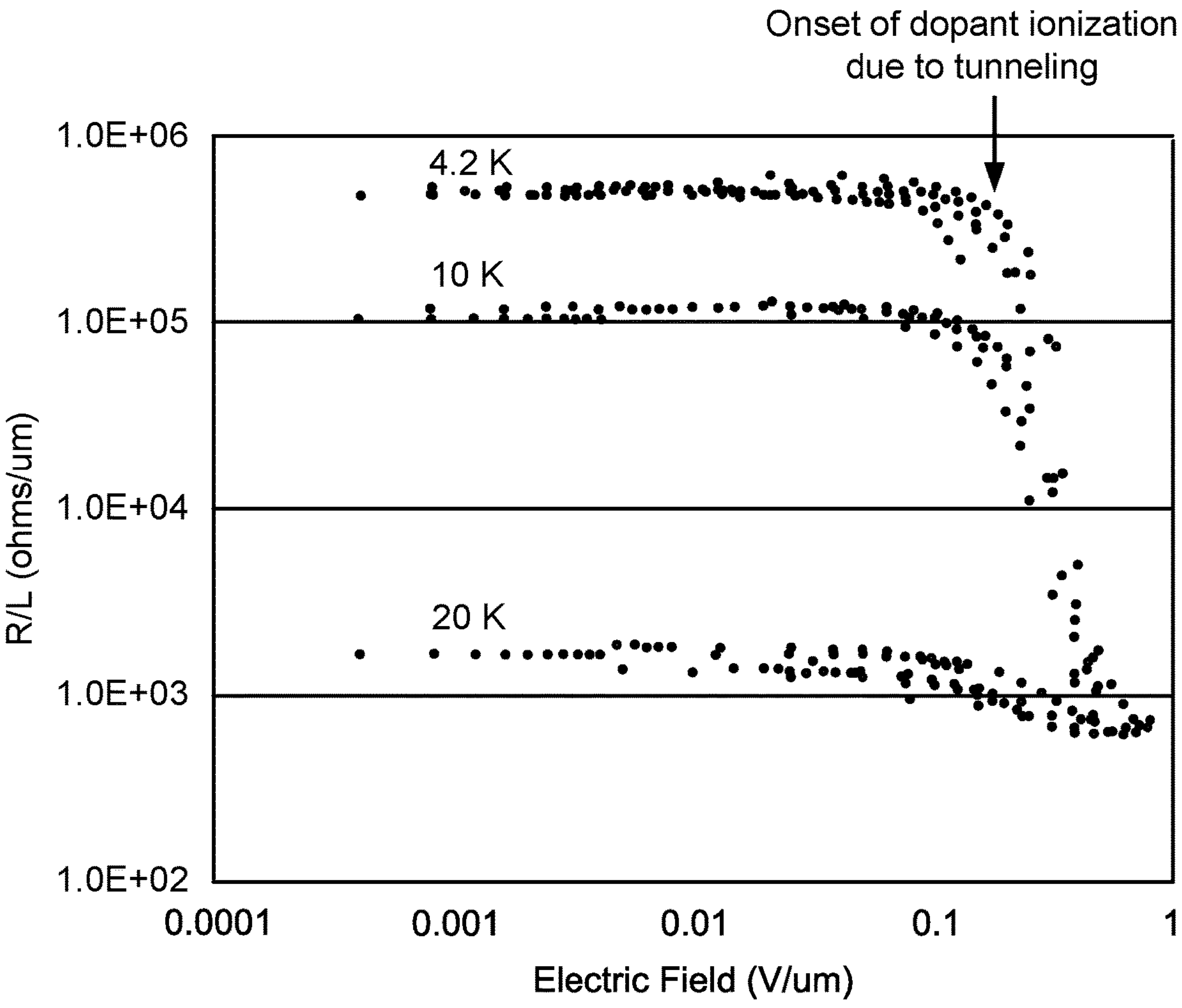
FIG. 2D is a plot illustrating resistance per unit length vs. applied electric field for a cryogenic bipolar diode according to an embodiment of the present invention.

FIG. 2D is a plot illustrating resistance per unit length vs. applied electric field for a cryogenic bipolar diode according to an embodiment of the present invention. In FIG. 2D, the resistance per unit length (R/L) of a silicon region doped to $7.2\times10^{17}$ $cm^{-3}$ with boron (i.e., a silicon strip) is plotted against the electric field applied along the silicon strip. Measurements were made at several different temperatures (4.2K, 10K, and 20K). The data in the plot was obtained for silicon strips of varying length and the results are independent of this length scale.

Below the transition, which occurs between 0.1 V/μm and 0.6 V/μm, the resistance as a function of length (R/L) is independent of the applied field and relatively high because a majority of the carriers are frozen out. The fraction of carriers that are frozen at low field increases as the temperature decreases, illustrated by the decreasing resistance per length at constant applied field (e.g., 0.001 V/μm). At a few tenths of a volt per micron the resistance drops drastically at low temperature due to field ionization of the dopants. Above the transition, the curves approach similar values of R/L (~$1\times10^3$) because full ionization is reached and the mobility is a relatively weak function of temperature in this range. Thus, by applying a relatively small electric field at a fixed ambient temperature it should be possible, for the right doping level, to achieve multiple decade (e.g., 7 or more decades) changes in R/L measured as a function of temperature.

FIG. 3A is a simplified plan view schematic diagram illustrating a cryogenic bipolar transistor according to an embodiment of the present invention. The cryogenic bipolar transistor 300 illustrated in FIG. 3A has elements that are similar to elements included in the cryogenic bipolar diode 100 described in relation to FIG. 1A and the description provided in relation to FIG. 1A is applicable as appropriate. Additionally, cryogenic bipolar transistor 300 can be coupled to a substrate, which can be thermally coupled to a cooling block and disposed in a cryostat as discussed with relation to cryogenic bipolar diode 100 in FIG. 1B. As a result, cryogenic bipolar transistor 300 can be operated at cryogenic temperatures as described more fully herein.

Cryogenic bipolar transistor 300 includes two contacts, contact 310 and contact 320, that are electrically connected to doped semiconductor region 330. In order to make ohmic contact to doped semiconductor region 330, an ohmic contact region 312 is utilized in conjunction with contact 310 and another ohmic contact region 322 is utilized in conjunction with contact 320. These ohmic contact regions can be highly doped semiconductor regions, silicide, or the like. As described herein in relation to other embodiments, some implementations utilize an ohmic contact in conjunction with a rectifying contact (e.g., a pn-junction of Schottky contact) in order to implement rectifying functionality. Thus, in addition to two ohmic contacts, one ohmic and one rectifying contact can be utilized.

In addition to these elements, which are similar to elements illustrated in FIG. 1A, two additional electrodes, i.e., first gate contact 340 and second gate contact 342 are utilized in cryogenic bipolar transistor 300 to provide transistor functionality. Referring to FIG. 3A, first gate contact 340 and second gate contact 342 are positioned on opposing sides of doped semiconductor region 330. The first gate contact 340 and second gate contact 342 extend along a predetermined length of doped semiconductor region 330, with the predetermined length being a function of the particular application. First gate contact 340 and second gate contact 342 are non-contacting electrodes in that they do not directly make electrical contact with the doped semiconductor region and are used to apply a field perpendicular to the doped semiconductor region that gates electrical conductivity of the doped semiconductor region.

As illustrated in FIG. 3A, the doped semiconductor region extends into the plane of the figure along the z-direction. Additionally, first gate contact 340 and second gate contact 342 extend not only along the length of doped semiconductor region 330 (i.e., in the x-direction), but also extend into the plane of the figure along the z-direction. Thus, although illustrated in plan view in FIG. 3A, it will be appreciated that a three dimensional structure is included within embodiments of the present invention. In some embodiments, doped semiconductor region 330 can be considered to have a first longitudinal surface (in the x-z plane) adjacent first gate contact 340 and a second, opposing longitudinal surface (in the x-z plane) adjacent second gate contact 342. In these embodiments, an electric field can be established across the doped semiconductor region by establishing an electric field between first gate contact 340, which is disposed adjacent the first longitudinal surface of doped semiconductor region 330, and second gate contact 342, which is disposed adjacent the second longitudinal surface of doped semiconductor region 330. In these embodiments, longitudinal surfaces are surfaces that extend along the length of the doped semiconductor region (i.e., the x-direction) as well as along a direction perpendicular to the length. One of ordinary skill in the art would recognize many variations, modifications, and alternatives.

It should be noted that the field supplied by first/second gate contacts 340/342 does not require that applied biases are symmetric about a potential that is midway between the biases on contacts 310/320. For example, if contact 320 is grounded and contact 31 is set at voltage $V_0$, the voltage on first gate contact 340 does not need to be set at $V_0/2+A$ with second gate contact 342 set at $V_0/2-A$. There may be advantages, for example, to setting second gate contact 342 at $V_0/2$ and raising the potential on first gate contact 340 to $V_0/2+A$. This drive configuration may be particularly applicable in cases for which first gate contact 340 and second gate contact 342 are positioned off-center along the length of doped semiconductor region 330. In some implementations, the potentials on first gate contact 340 and second gate contact 342 are not displaced symmetrically when turning the device 'on.' This mode of operation can be useful in preventing a decrease in the field along the length of doped semiconductor region 330 in the gap between the left or right edge of first gate contact 340 and second gate contact 342 and the neighboring electrode in a way that decreases the current at these locations.

Thus, a variable conductivity channel 332 is illustrated, in which the conductivity of the channel is controlled by application of a bias voltage applied to first gate contact 340 and second gate contact 342 that results in field ionization of carriers that are initially frozen out in variable conductivity channel 332. Thus, variable conductivity channel 332 can be operated in a non-conducting state associated with carrier freeze out, a conducting state associated with reversal of the carrier freeze out phenomenon via field ionization, and intermediate states of varying conductivity. Since the conductivity of variable conductivity channel 332 is controlled by the applied bias voltage applied to non-contacting first gate contact 340 and second gate contact 342, transistor-like operation is provided by embodiments of the present invention.

In the embodiment illustrated in FIG. 3A, in contrast with conventional CMOS transistors that are minority carrier devices, cryogenic bipolar transistor 300 is a majority carrier device. As an example, for an n-channel CMOS silicon-based transistor, a p-type silicon channel is utilized with n-type contacts as the source and drain. A potential is applied to the floating gate to invert the carrier concentration in the channel, attracting minority carriers toward the gate to produce a minority carrier channel connecting the n-type source and drain, with the minority carrier channel having the same sign as the source/drain contacts. In contrast with this conventional operation, cryogenic bipolar transistor 300 has source and drain contacts (i.e., contact 310 and contact 320) that have the same doping type (i.e., n-type or p-type) corresponding to the carrier concentration in the variable conductivity 332 channel produced through field ionization resulting from application of the bias voltage applied to first gate contact 340 and second gate contact 342, i.e., the contacts are doped with the same dopant type (n or p) as the variable conductivity channel 332. Thus, a majority carrier device is implemented in embodiments of the present invention. It should be noted that although operation in the context of two ohmic contacts is utilized for contact 310 and contact 320 as discussed in relation to FIG. 3A, other embodiments can utilize a rectifying contact as one of the contacts.

Thus, by adding electrodes (i.e., first gate contact 340 and second gate contact 342) along a portion of the length of the doped semiconductor region 330 having ohmic contacts at either end, cryogenic bipolar transistor 300 can be considered as a device that can be operated like a transistor. In contrast with minority carrier devices, by applying an electric field between the non-contacting electrodes (i.e., first gate contact 340 and second gate contact 342), the dopants in the strip that are frozen out because of the low temperature operation, can be ionized. The carriers created by the lateral field (i.e., the y-direction in FIG. 3A) will tend to accumulate along the sides of the doped semiconductor region in order to screen this applied field. Subsequently, the increased carrier concentration in the doped semiconductor region will lower the resistance of the strip, so a bias applied along the length of the device (i.e., the x-direction in FIG. 3A) will result in an increase in current flow between contact 310 and contact 320. Thus, the non-contacting electrodes act as a "gate" for conduction along the doped semiconductor region, which acts as a "channel." Therefore, a relatively small bias across the narrow gap between the non-contacting electrodes can be amplified to yield a very large change in the effective resistance of the doped semiconductor region (i.e., many orders of magnitude).

It should be noted that the four terminal cryogenic bipolar transistor illustrated in FIG. 3A can be modified to provide a three terminal device by connecting either first gate contact 340 or second gate contact 342 to a fixed potential (e.g., ground). Additionally, one of the gate contacts could be removed to provide an implementation similar to a transistor with one gate electrode (and sometimes an independently controlled body bias).

An important distinction between the cryogenic bipolar transistors discussed herein and conventional CMOS transistors is that the applied biases can have values less than the bandgap of the material utilized to form the variable conductivity channel. As an example, if the variable conductivity channel is a silicon channel, with a bandgap of ~1.12 eV (depending on the temperature), the bias voltage applied across the silicon channel can be significantly less than the bandgap. For instance, given a negligible potential drop across the material positioned between first gate contact 340 and second gate contact 342 and doped semiconductor region 330, which can be the equivalent of a "gate oxide" having thin dimensions or a large dielectric constant, if the width of the silicon channel is 0.1 μm and the critical field used to field ionize is 200 mV/μm, an applied bias voltage of 20 mV will begin to field ionize the dopants in the silicon channel. Thus, operating voltages can be lower than operating voltages associated with CMOS devices.

A variety of semiconductor materials can be utilized as the host material, as well as a variety of dopant species. By choosing pairs of host materials and dopants with large ionization energies, it may be possible to increase the operating temperature up to room temperature or beyond. Larger ionization energies lead to dopant freeze out at room temperature (or higher). As an example, Ga is a p-type dopant in Si with an ionization energy of 72 meV. Ni and Cu are p-type dopants in GaAs with activation energies over 200 meV. Many other dopant/host pairs exist with ionization energies that span a very large range. Alternatively, material pairs with a low activation energy can be chosen to lower the required ionization field at low temperature. As an example, Sb, P, and As are n-type dopants in Ge with ionization energies of 9.6, 12, and 13 meV, respectively.

Materials may also be chosen for which ionized dopant ions have a smaller impact on the mobility. When the dopant atoms are field-ionized, the resulting charged ions tend to scatter carriers and reduce their mobility. This decrease in mobility can partially offset the improved conductivity due to the increase in carrier concentration. To maximize the increase in conductivity upon field-ionization, host materials and dopant species can be chosen to reduce or minimize the scattering of carriers by ionized dopants. This can be accomplished, for example, by choosing materials with increased screening of ionized dopants, e.g., a host semiconductor with a large dielectric constant. This will provide a larger change in resistance upon field ionization (i.e., a larger on-off ratio).

FIG. 3B is a simplified plan view schematic diagram illustrating a plurality of cryogenic bipolar transistors 345 in parallel according to an embodiment of the present invention. As illustrated in FIG. 3B, an array of doped semiconductor regions 370 are disposed between source and drain contacts in the form of a parallel array of doped semiconductor regions that will exhibit transistor-like behavior in response to the positioning of non-contacting electrodes adjacent the doped semiconductor regions to provide the gating field.

Using multiple doped semiconductor regions instead of a single doped semiconductor region allows for lower gating biases on the non-contacting electrodes to provide a sufficient electrical field while still enabling larger currents. For simplicity, the positive non-contacting electrodes for all the doped semiconductor regions can be joined to a common electrode and, similarly, the negative non-contacting electrodes can be electrically connected. Alternatively, the biases on the non-contacting electrodes can be controlled independently to provide finer control over the net conduction between the contacts or step-like control of the conduction. Moreover, another embodiment can utilize parallel doped semiconductor regions with different widths. The widest doped semiconductor regions would enable coarse control over the net current and the narrower doped semiconductor regions would enable fine control of the net current. One of ordinary skill in the art would recognize many variations, modifications, and alternatives.

The plurality of cryogenic bipolar transistors illustrated in FIG. 3B utilize doped semiconductor regions 370*a*, 370*b*, 370*c*, and 370*n* in conjunction with positive non-contacting electrodes 372*a* through 372*n* as well as negative non-contacting electrodes 374*a* through 374*n* to provide the gating field produced using these positive and negative non-contacting electrodes. Electrical leads to positive non-contacting electrodes 372*a* through 372*n* and negative non-contacting electrodes 374*a* through 374*n* are not shown for purposes of clarity. Source contacts 352*a*, 352*b*, 352*c*, through 352*n* are connected to first parallel contact 350. Drain contacts 362*a*, 362*b*, 362*c*, through 362*n* are connected to second parallel contact 360. Additionally, as described herein, three terminal implementations (e.g., one gate electrode) are included within the scope of the present invention and could be implemented in relation to the parallel doped semiconductor regions. Moreover, four terminal implementations in which all the positive non-contacting electrodes 372*a* through 372*n* are electrically connected and/or all the negative non-contacting electrodes 374*a* through 374*n* are electrically connected to each other are included.

In addition to the plan view implementation of a plurality of cryogenic bipolar transistors operated in parallel illustrated in FIG. 3B, the plurality of cryogenic bipolar transistors could be implemented such that FIG. 3B would be a side view, with the non-contacting electrodes extending into the plane of the figure, for example, as a stack of films. Thus, implementations in which the non-contacting electrodes have a thickness equal to the thickness of the doped semiconductor region can be implemented as well as architectures in which the thickness of the non-contacting electrodes is greater than the thickness of the doped semiconductor region.

Figure 3C:
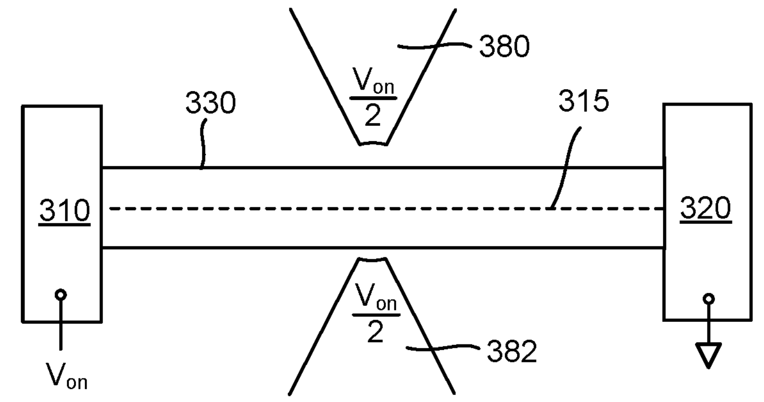
FIG. 3C is a simplified plan view schematic diagram illustrating a four terminal bipolar transistor in a first operating condition according to an embodiment of the present invention.
Figure 3D:
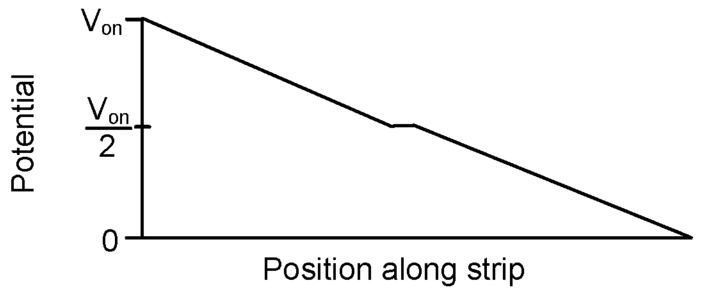
FIG. 3D is a simplified plot illustrating potential as a function of position according to an embodiment of the present invention.

FIG. 3C is a simplified plan view schematic diagram illustrating a four terminal bipolar transistor in a first operating condition according to an embodiment of the present invention. FIG. 3D is a simplified plot illustrating potential as a function of position according to an embodiment of the present invention. Referring to FIG. 3C, a mode of operation is implemented in which a bias, $V_{on}$, that is large enough to field ionize doped semiconductor region 330 (as if first gate contact 380 and second gate contact 382 were not present or were present with an applied bias midway between the bias applied between contact 310 and contact 320) is applied between contact 310 and contact 320. In other words, in either case, the potential midway between 310 and 320 must be approximately midway between the potential of 310 and 320 so that the field is fairly constant along 330 and larger than the field-ionization threshold. Thus, because first gate contact 380 and second gate contact 382 only cover a small fraction of the length of doped semiconductor region 330 as illustrated in FIG. 3D, for example, 10% of the length of the doped semiconductor region 330, then applying a bias to first gate contact 380 and second gate contact 382 could be used to turn the current flowing along doped semiconductor region 330 off.

In alternative implementations and as a variation on the embodiment illustrated in FIG. 3C (or FIG. 3E) first gate contact 380 and second gate contact 382 can be positioned other than midway between contact 310 and contact 320. For example, if first gate contact 380 and second gate contact 382 were positioned closer to contact 310, then a larger portion of doped semiconductor region 330 can be made resistive by raising the potential on first gate contact 380 and second gate contact 382. This modification in operation may be accompanied by a change in the bias on first gate contact 380 and second gate contact 382 by a larger amount to affect a change. Thus, by moving first gate contact 380 and second gate contact 382 to an off-center position, it is possible to achieve an increased on-off ratio in exchange for an increased signal bias. It should be noted that in the equivalent of FIG. 3C in this alternative implementation, the bias on first gate contact 380 and second gate contact 382 in the 'on' state would not be $V_{on}/2$. Rather, if first gate contact 380 and second gate contact 382 were positioned at a distance 'a' from contact 320, which is grounded, then in the 'on' state, the bias on first gate contact 380 and second gate contact 382 would be $(a/L)V_{on}$ where L is the distance between contact 310 and contact 320.

The inventors have determined that the optimum length of first gate contact 380 and second gate contact 382, as measurement is made along doped semiconductor region 330, is dependent on the width and length of doped semiconductor region 330 (and the gap between first gate contact 380 and second gate contact 382 and doped semiconductor region 330, as well as the relative dielectric constants of doped semiconductor region 330 and the intervening material (likely an insulator such as $SiO_2$)). As described herein, designs in which first gate contact 380 and second gate contact 382 cover a fairly short portion of doped semiconductor region 330 enable operation that results in field ionization of carriers and the ability to turn the transistor on. As the length of first gate contact 380 and second gate contact 382 increases relative to the width or length of doped semiconductor region 330 it will cause the flat part of the curve in FIG. 3D to increase in length, resulting in the formation of a longer, low-field, un-ionized region that will, in turn, result in increased resistivity. Thus, embodiments of the present invention utilize dimensions (i.e., length) of first gate contact 380 and second gate contact 382 along doped semiconductor region 330 that are short relative to the overall length of doped semiconductor region 330, thereby producing a relatively short flat portion in FIG. 3D. At the same time, the length of first gate contact 380 and second gate contact 382 is sufficient to pull the potential up along the centerline 315 of doped semiconductor region 330 between first gate contact 380 and second gate contact 382 in order to turn the device off without applying a large potential on first gate contact 380 and second gate contact 382. The inventors have also determined that the length of first gate contact 380 and second gate contact 382 will depend on the width of doped semiconductor region 330. In other words, embodiments of the present invention consider a second dimension in FIG. 3D, namely the dimension perpendicular to the strip. If the strip is wide relative to the length of first gate contact 380 and second gate contact 382 along doped semiconductor region 330, then the potential will vary across the width of the strip. Thus, it is possible to continue to have a field along the strip at its midline even when operation is directed toward turning the transistor off by bringing the potential on first gate contact 380 and second gate contact 382 close to either contact 310 or contact 320.

In another embodiment, first gate contact 380 and second gate contact 382 are replaced by a conducting strip that runs across doped semiconductor region 330 (i.e., from top to bottom as illustrated in FIG. 3C), but is separated from doped semiconductor region 330 by an insulating layer, for example, a thin insulating layer. In this embodiment, this conducting strip acting as a gate could also run below doped semiconductor region 330. In this embodiment in which first gate contact 380 and second gate contact 382 are replaced by a conducting strip, a three terminal device can be implemented. A four terminal device can be implemented if first gate contact 380 and second gate contact 382 are replaced with two conducting strips, one above and one below doped semiconductor region 330. Moreover, other versions are included within the scope of the present invention, including the utilization of non-contacting gate electrodes both above and below doped semiconductor region 330.

If, for example, first gate contact 380 and second gate contact 382 are positioned midway between contacts 310 and 320 as shown in FIG. 3C, and the bias applied to first gate contact 380 and second gate contact 382 is equal to $V_{on}/2$, and if the separation between first gate contact 380 and second gate contact 382 is smaller than or comparable to the extension of first gate contact 380 and second gate contact 382 along the length of doped semiconductor region 330, the potential will be relatively constant across the width of doped semiconductor region 330 between first gate contact 380 and second gate contact 382 and approximately equal to $V_{on}/2$. If the extension of first gate contact 380 and second gate contact 382 along doped semiconductor region 330 is also short relative to the length of doped semiconductor region 330 then you would also have an essentially uniform field along the length of the doped semiconductor region 330 (essentially the same field as if first gate contact 380 and second gate contact 382 were not present, i.e., an electric field large enough to field ionize doped semiconductor region 330 along most of its length). Since the applied electric field is high enough along the doped semiconductor region (referred to as a strip in FIG. 3C) to field ionize carriers along doped semiconductor region 330, current can flow between contact 310 and contact 320. It should be noted that first gate contact 380 and second gate contact 382 can be designed as narrow features so that, in the configuration in FIG. 3C, they make minimal impact on the uniformity of the electric field along the length of doped semiconductor region 330.

However, if, as described more fully in relation to FIGS. 3E and 3F below, the potential on first gate contact 380 and second gate contact 382 are raised to a value that is closer to the potential present at contact 310 (or contact 320), then the field along doped semiconductor region 330 between contact 310 and first/second gate contact 380/382 would fall below the field ionization threshold and the resistance along the portion of the doped semiconductor region between contact 310 and first gate contact 380 and second gate contact 382 would increase because the carrier concentration in this region would decrease. In this portion, the resistance of this portion of doped semiconductor region 330 would go up dramatically in comparison with the configuration illustrated in FIG. 3C.

Figure 3E:
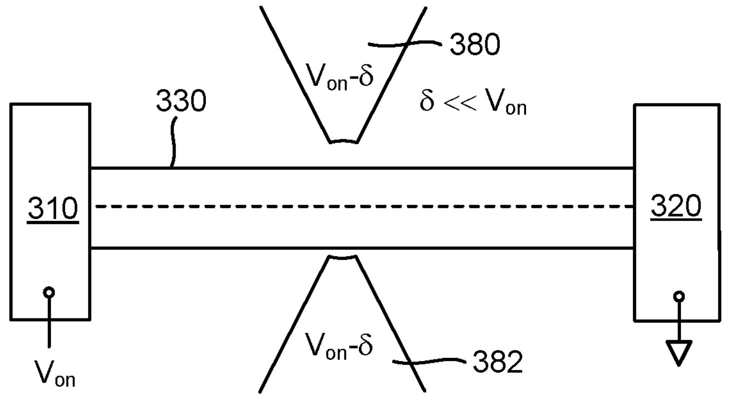
FIG. 3E is a simplified plan view schematic diagram illustrating a four terminal bipolar transistor in a second operating condition according to an embodiment of the present invention.

FIG. 3E is a simplified plan view schematic diagram illustrating a four terminal bipolar transistor in a second operating condition according to an embodiment of the present invention. FIG. 3F is a simplified plot illustrating potential as a function of position according to an embodiment of the present invention. As discussed above, in this second operating condition, $\delta << V_{on}$ and the potential present at the first/second gate contact 380/382 is similar to the potential present at contact 310. As a result, the potential drop along the doped semiconductor region between contact 310 and first gate contact 380 and second gate contact 382 decreases toward δ. Because the potential as a function of position is relatively flat between contact 310 and first gate contact 380 and second gate contact 382, the applied field in this region is low. As a result, the field in this region will drop below the critical field for field ionization and therefore, the resistance in this region will be high and the transistor can be turned off. Alternatively, the voltages could be set so that the other portion of the structure, between first gate contact 380 and second gate contact 382 and contact 320, could be highly resistive. It should be noted that δ could be positive or negative. In some embodiments, the potential at first gate contact 380 and second gate contact 382 is slightly below $V_{on}$ as illustrated in FIG. 3F. However, in other embodiments, a larger potential can be applied to first gate contact 380 and second gate contact 382 relative to doped semiconductor region 310 to more fully turn off the current. In either case, the magnitude of δ will remain fairly small in most embodiments and the sign of δ can be positive or negative.

It should be noted this architecture is resistant to self-heating and damage effects since, although the portion of the doped semiconductor region between first/second gate contact 380/382 and contact 320 may remain field ionized, the high resistance between first/second gate contact 380/382 and contact 310 is in series with the portion between contact 310 and first/second gate contact 380/382. As a result, the current flow along doped semiconductor region 330 is low, preventing self-heating and/or damage.

Figure 4:
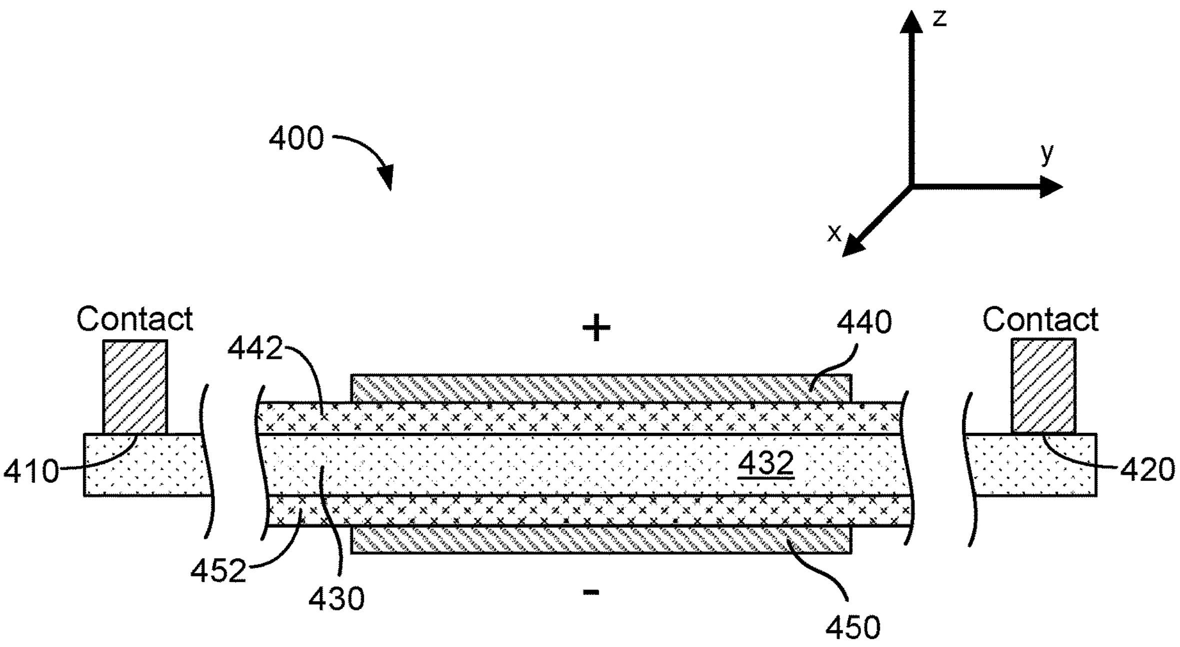
FIG. 4 is a simplified cross sectional schematic diagram of a cryogenic bipolar transistor according to an alternative embodiment of the present invention.

FIG. 4 is a simplified cross sectional schematic diagram of a cryogenic bipolar transistor according to an alternative embodiment of the present invention. As illustrated in FIG. 4, a vertical geometry is utilized in which the doped semiconductor region represented by doped silicon layer 430 is disposed in the x-y plane and layer fabrication (e.g., via doping, oxidation or deposition) progresses in the vertical direction (i.e., the z-direction). Doped silicon layer 430 can be single crystal and fabrication can utilize SOI techniques or can be polysilicon amorphous silicon, or the like. The vertical structure illustrated in FIG. 4 enables device structures with small device dimensions (for example, the layer thickness), which allow lower biases to provide the requisite electric fields. Moreover, the vertical structure illustrated in FIG. 4 enables device structures with highly controlled layer thicknesses, which can improve device performance. For example, SOI enables the use of silicon layers that can have extremely thin dimensions and precisely defined thicknesses, for example, a 100 nm layer, which will result in low voltage operation (e.g., tens of millivolts).

In the vertical device geometry illustrated in FIG. 4, which is applicable to both diode-like and transistor-like devices, the conduction in the doped semiconductor region is generated using non-contacting electrodes (i.e., gate contacts) that are disposed above and below the doped silicon layer. Alternatively, devices can be fabricated in which the conduction is along the z-direction, with anode/cathode or source/drain contacts above and below the conducting channel. Thus, a variety of device geometries can be utilized according to various embodiments of the present invention.

Referring to FIG. 4, cryogenic bipolar transistor 400 includes two contacts, contact 410 and contact 420, that are electrically connected to doped semiconductor layer 430. In order to make ohmic contact to doped semiconductor layer 430, an ohmic contact region (not shown for clarity) is utilized in conjunction with contact 410 and another ohmic contact region (not shown for clarity) is utilized in conjunction with contact 420. These ohmic contact regions can be highly doped semiconductor regions, silicide, or the like. As discussed herein in relation to bipolar diode implementations, one of the contacts can be rectifying.

In addition to these elements, which are similar to elements illustrated in FIG. 3A, two additional electrodes, i.e., first gate contact 440, also referred to as a top gate contact, and second gate contact 450, also referred to as a bottom gate contact, are utilized in cryogenic bipolar transistor 400 to provide transistor functionality. Referring to FIG. 4, first gate contact 440 and second gate contact 450 are positioned on opposing sides of doped semiconductor layer 430. First gate contact 440 and second gate contact 450 extend along a predetermined length and width (extending into the plane of the figure in the +/−x direction) of doped semiconductor layer 430, with the predetermined length and widths being a function of the particular application. First gate contact 440 and second gate contact 450 are separated from doped semiconductor layer 430 by oxide layer 442 and oxide layer 452, respectively, resulting in non-contacting electrodes that do not directly make electrical contact with the doped semiconductor layer and are used to apply a field perpendicular to the doped semiconductor layer (i.e., in the z-direction) that gates electrical conductivity of the doped semiconductor layer.

Thus, a variable conductivity channel 432 is illustrated, in which the conductivity of the variable conductivity channel is controlled by application of a bias voltage applied to first gate contact 440 and second gate contact 450 that results in field ionization of carriers that are initially frozen out in variable conductivity channel 432. Thus, variable conductivity channel 432 can be operated in a non-conducting state associated with carrier freeze out, a conducting state associated with reversal of the carrier freeze out phenomenon via field ionization, and intermediate states of varying conductivity. Since the conductivity of variable conductivity channel 432 is controlled by the applied bias voltage applied to non-contacting first gate contact 440 and second gate contact 450, transistor-like operation is provided by embodiments of the present invention.

Figure 3F:
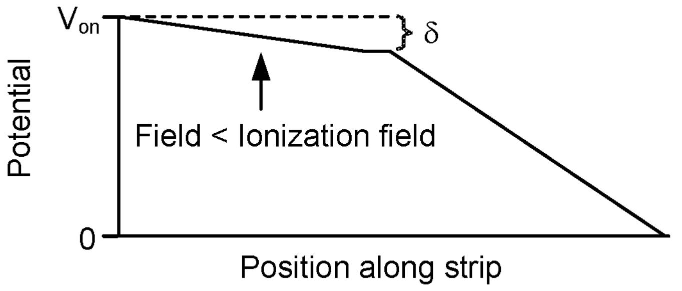
FIG. 3F is a simplified plot illustrating potential as a function of position according to an embodiment of the present invention.

Moreover, as discussed in relation to FIGS. 3D-3F, embodiments of the present invention can include modes of operation in which the source to drain bias is sufficient to turn on the channel when the gate bias is midway (or close to midway) between the source and drain bias. The channel is then turned off by driving the gate(s) bias close to either source or drain potential so that the field along a section of the doped semiconductor region is too low for field ionization. This operational mode can be implemented for device architectures in which the gate electrodes only extend a short distance along the channel. One of ordinary skill in the art would recognize many variations, modifications, and alternatives.

As discussed above in relation to FIG. 3A, the majority carrier operation of the cryogenic bipolar transistor is evident in the type (i.e., either n-type or p-type) of the source and drain contacts (e.g., first contact 410 and second contact 420, respectively) having the same type as the type of variable conductivity channel 432. Thus, n-type contacts can be used for first contact 410 and second contact 420 in conjunction with n-type doped silicon for variable conductivity channel 432. Similarly, p-type contacts can be used for first contact 410 and second contact 420 in conjunction with p-type doped silicon for variable conductivity channel 432. Thus, ohmic contacts are included within the scope of the present invention. Moreover, in some embodiments, one or more of the contacts are rectifying and not ohmic; for example, an n-type contact can be used for first contact 410 (i.e., an ohmic contact) and a p-type contact can be used for second contact 420 (i.e., a rectifying contact) in conjunction with n-type doped silicon for variable conductivity channel 432.

It should be noted that the device geometry illustrated in FIG. 4 enables cryogenic bipolar transistors that have layers thin enough to provide operating voltages that are lower than standard CMOS devices. Referring to FIG. 4, the thickness of doped silicon layer 430 can be thin enough that a voltage bias, applied between gate contacts 470 and 472 sufficient to result in current flow between contacts 410 and 420, can be lower than the bandgap of silicon. Thus, operating voltages substantially lower than standard CMOS transistors can be achieved. In standard CMOS transistors, in order to invert the channel and place the channel in the on-state, the applied voltage bias is on the order of the bandgap of the host material, for example, ~1.1 eV for silicon. In the cryogenic bipolar transistor 400 illustrated in FIG. 4, the ionization field that is generated by applying a bias voltage only has to be high enough to field ionize the dopants present in the doped semiconductor region. Because this ionization field strength can be on the order of 0.1-1 V/μm, a 0.1 μm thick doped silicon layer 430 can be characterized by operating voltages on the order of 0.01 V to 0.1 V. Thus, embodiments of the present invention are able to utilize thin film structures that can be operated at very low biases in comparison to conventional devices, thereby creating a large enough electric field to field ionize the dopants previously frozen out at cryogenic temperatures. One of ordinary skill in the art would recognize many variations, modifications, and alternatives.

Figure 5:
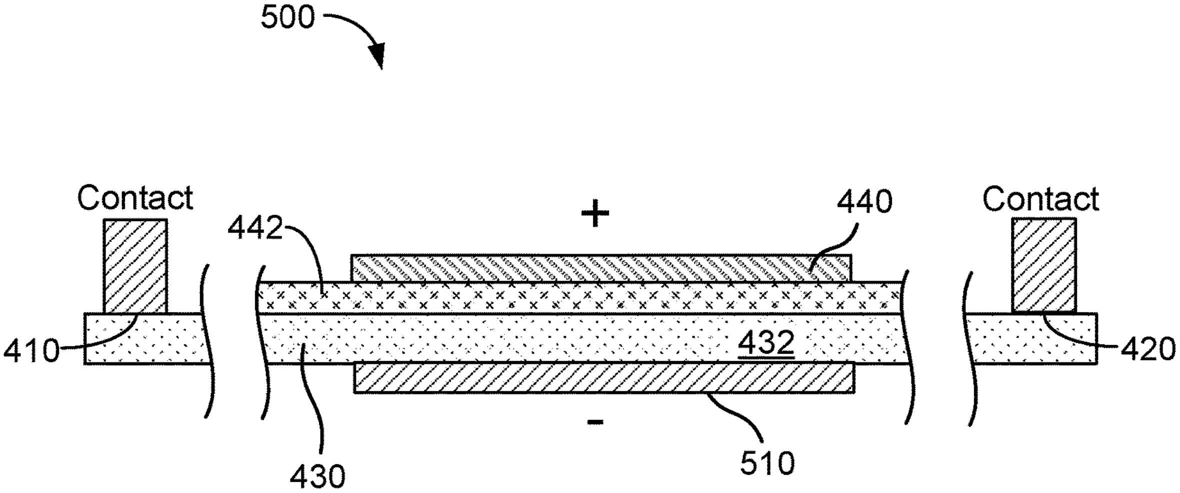
FIG. 5 is a simplified cross sectional schematic diagram of a cryogenic bipolar transistor according to another alternative embodiment of the present invention.

FIG. 5 is a simplified cross sectional schematic diagram of a cryogenic bipolar transistor according to another alternative embodiment of the present invention. The cryogenic bipolar transistor illustrated in FIG. 5 shares common elements with the cryogenic bipolar transistor illustrated in FIG. 4 and the description provided in relation to FIG. 4 is applicable to FIG. 5 as appropriate.

Referring to FIG. 5, cryogenic bipolar transistor 500 includes two contacts, contact 410 and contact 420, that are electrically connected to doped semiconductor layer 430. In order to make ohmic contact to doped semiconductor layer 430, an ohmic contact region (not shown for clarity) is utilized in conjunction with contact 410 and another ohmic contact region (not shown for clarity) is utilized in conjunction with contact 420. These ohmic contact regions can be highly doped semiconductor regions, silicide, or the like.

In addition to these elements, which are similar to elements illustrated in FIG. 4, two additional electrodes, i.e., first gate contact 440, also referred to as a top gate contact, and second gate contact 510, also referred to as a bottom gate contact, are utilized in cryogenic bipolar transistor 400 to provide transistor functionality. Referring to FIG. 4, first gate contact 440 and second gate contact 510 are positioned on opposing sides of doped semiconductor layer 430. First gate contact 440 and second gate contact 510 extend along a predetermined length and width (extending into the plane of the figure in the +/−x direction) of doped semiconductor layer 430, with the predetermined length and widths being a function of the particular application.

First gate contact 440 is separated from doped semiconductor layer 430 by oxide layer 442, resulting in a non-contacting electrode that does not directly make electrical contact with the doped semiconductor layer. Second gate contact 510, which can be a body contact, is a rectifying contact. Together, the non-contacting electrode of first gate contact 440 and the rectifying electrode of second gate contact 510 are used to apply a field perpendicular to the doped semiconductor layer (i.e., in the z-direction) that gates electrical conductivity of the doped semiconductor layer as a result of the generation of the ionizing field.

In the embodiment illustrated in FIG. 5, bottom gate electrode 510 is p-type silicon in electrical contact with n-type silicon as the doped semiconductor material in doped semiconductor layer 430. An interconnect (not shown) can be electrically connected to bottom gate electrode 510 to provide external access to the body contact. Thus, embodiments of the present invention, in addition to utilizing non-contacting electrodes as illustrated in FIG. 4, can utilize rectifying contacts by forming a p-n junction that is reversed biased, thereby preventing leakage. Moreover, a rectifying contact, for example, bottom gate electrode 510, can provide advantages in terms of ease of manufacture and reduced operating voltages. In addition to p-type silicon, other materials that would provide a rectifying contact, e.g., a metal that forms a Schottky contact, for either the bottom gate electrode or the top gate electrode can be utilized in accordance with the present invention.

Although a rectifying contact has been illustrated in relation to the structure shown in FIG. 5, it will be appreciated that a rectifying contact can be implemented in the other designs illustrated herein. As an example, cryogenic bipolar diode 100 illustrated in FIG. 1A can be modified to form a unipolar diode as discussed above. Moreover, it will be appreciated that altering the geometry of the devices described herein, for example, the number of strips, strip width, strip length, in-plane vs. out-of-plane electrodes, and the like, along with the doping levels and the dopant species enables independent control of device performance characteristics such as on-off resistance ratio, bias levels, and current levels. One of ordinary skill in the art would recognize many variations, modifications, and alternatives.

Furthermore, the addition of a second dopant of an opposite type (i.e., n-type vs p-type) at a lower doping level to partially compensate the primary dopant can also be advantageous for engineering the device response. This can have an impact on the mobility and how it changes upon field ionization. Also, if dopants with a different critical field for ionization are chosen, the shape of the resistance transition with field can be tailored. In some embodiments, the use of multiple dopants is implemented to customize the temperature dependence of the resistance vs. field response.

Figure 6A:
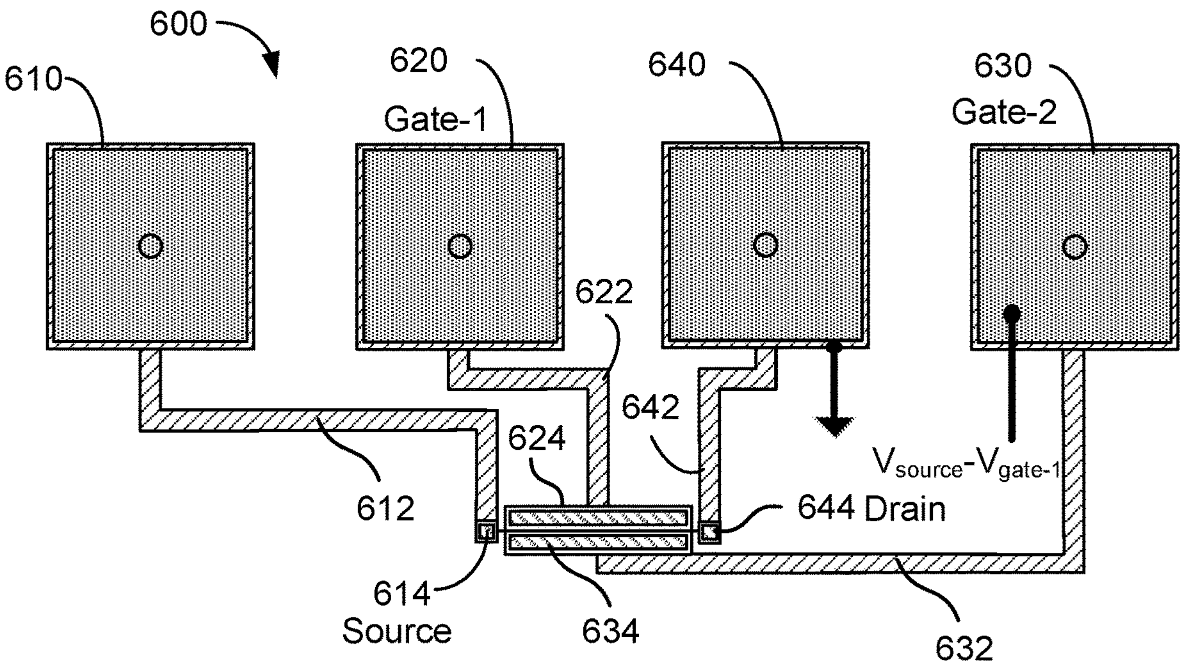
FIG. 6A is a simplified plan view schematic diagram illustrating testing electrodes for a cryogenic bipolar transistor according to an embodiment of the present invention.

FIG. 6A is a simplified plan view schematic diagram illustrating testing electrodes for a cryogenic bipolar transistor according to an embodiment of the present invention. In FIG. 6A, a cryogenic bipolar transistor 600 with a structure similar to that shown in FIG. 3A is utilized, with contact 614 (i.e., source contact) electrically connected to external contact 610 through lead line 612 and contact 644 (i.e., drain contact) electrically connected to external contact 640 through lead line 642.

In order to provide the gate bias to the variable conductivity channel, non-contacting electrodes 624 and 634 are utilized, with the gate bias applied from external contacts 620 and 630, respectively, along with lead lines 622 and 632, respectively. As illustrated in FIG. 6A, a gate bias ($V_{gate\ 1}$) is applied to external contact 620 and a gate bias ($V_{source}-V_{gate\ 1}$) is applied to external contact 630.

Figure 6B:
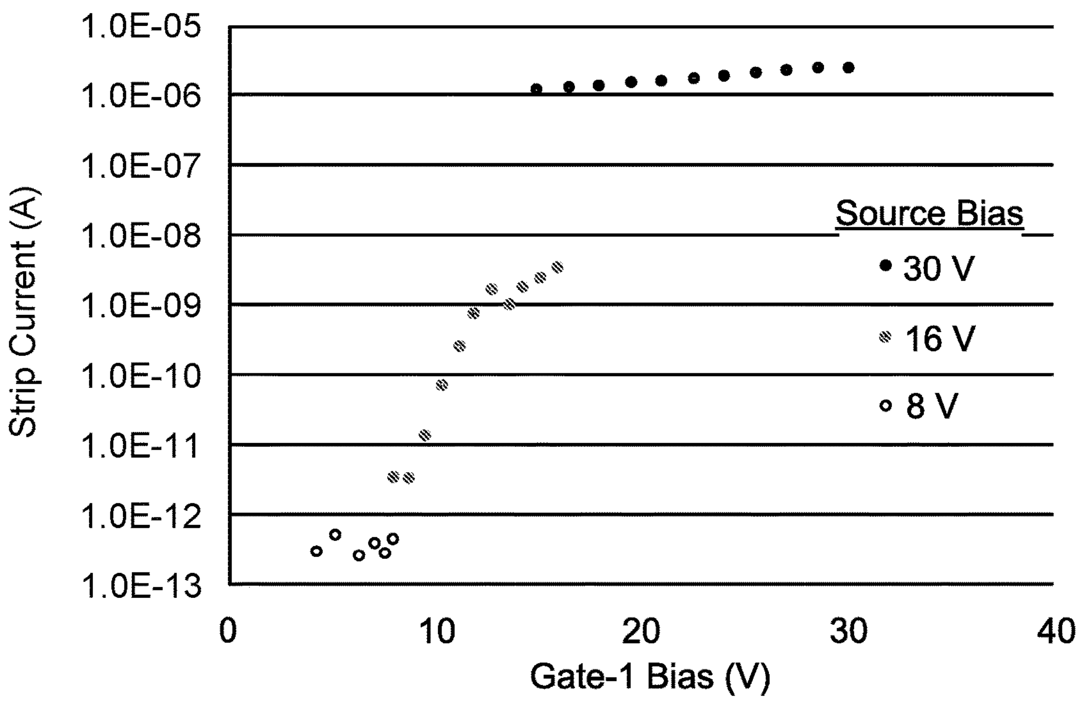
FIG. 6B is a plot illustrating current vs. applied bias for the cryogenic bipolar transistor illustrated in FIG. 5.

FIG. 6B is a plot illustrating current vs. applied bias for the cryogenic bipolar transistor illustrated in FIG. 6A. Referring to FIG. 6B, a plot of strip current as a function of applied gate bias is shown for several applied source/drain bias levels. In FIG. 6B, Source Bias is the voltage applied to external contact 610 (i.e., the source contact) and external contact 640 (i.e., the drain contact) is grounded. Three operating levels of the source bias are illustrated, 30 V, 16 V, and 8 V. The voltage applied to establish the gate field is illustrated as Gate-1 Bias and Gate-2 Bias in FIGS. 6A and 6B. By applying a voltage of $V_{gate\text{-}1}$ to external electrode 624 (i.e., Gate 1) and ($V_{source}-V_{gate\ 1}$) to external electrode 634 (i.e., Gate 2), the applied gate bias is centered between the source/drain bias voltage.

Referring to FIG. 6B, at an applied source/drain voltage of 8 V, the gate voltages range from 0 V to 8 V, which is not sufficient to result in field ionization. In contrast, at an applied source/drain voltage of 30 V, the gate voltages ranging from 15 V to 30 V are sufficient to produce field ionization at all gate voltages, with negligible change in current as a function of gate voltage. In the intermediate region, with gate voltages ranging from 8 V to 16 V, increasing field ionization in the variable conductivity channel results in an increase in current in the variable conductivity channel that extends over three decades of current, increasing from $\sim 1\times10^{-11}$ A to $\sim 1\times10^{-8}$ A. In the embodiment illustrated in FIGS. 6A and 6B, device dimensions were relatively large to facilitate fabrication. However, in other implementations, the device dimensions can be small (e.g., thickness of the variable conductivity channel across which the gate bias is applied of submicron dimensions, for example, tens of nanometers, to 100 nm to 1 μm) and the resulting bias voltages can be smaller, for example, 300 mV, 250 mV, 200 mV, 150 mV, 100 mV, 75 mV, 50 mV, 25 mV, 10 mV, or less than 10 mV, thereby enabling operation at much lower biases than conventional devices. Thus, the present invention is not limited to the performance level demonstrated by the device illustrated in FIG. 6A and increased levels of performance, for example, an increase in current in the variable conductivity channel that extends over four, five, six, seven, eight or more decades of current are included within the scope of the present invention.

Figure 7A:
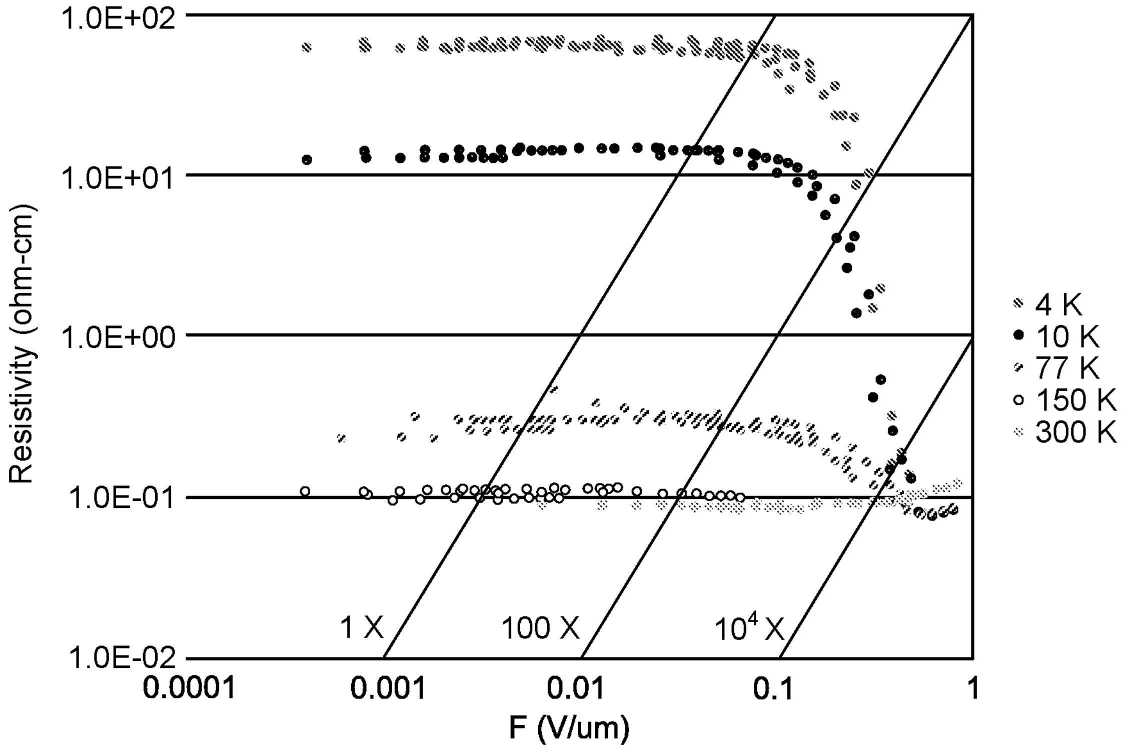
FIG. 7A is a plot illustrating resistivity vs. applied bias for an n-type cryogenic bipolar diode according to an embodiment of the present invention.

FIG. 7A is a plot illustrating resistivity vs. applied field for an n-type cryogenic bipolar diode according to an embodiment of the present invention. Similar to the discussion related to FIG. 2D, as the applied field increases, field ionization of dopants frozen out at low temperature results in dramatic decreases in resistivity. Referring to FIG. 7A, for operation at 4 K, the resistivity is ~100 Ohm-cm for applied fields less than 0.1 V/μm. As the applied field increases to values greater than 0.1 V/μm, the resistivity begins to drop, decreasing to 0.1 Ohm-cm for an applied field of ~0.5 V/μm. Thus, field ionization of carriers at 4 K can produce approximately three orders of magnitude variation in resistivity for silicon doped with boron at a dopant density of $7.2\times10^{17}$ $cm^{-3}$. Similarly for operation at 10 K, the resistivity is ~10 Ohm-cm for applied fields less than 0.1 V/μm. As the applied field increases to values greater than 0.1 V/μm, the resistivity begins to drop, decreasing to 0.1 Ohm-cm for an applied field of ~0.5 V/μm. Thus, field ionization of carriers at 10 K can produce approximately two orders of magnitude variation in resistivity. As the operating temperature increases, thermal ionization results in a decrease in resistivity such that, at 150 K and 300 K, substantially all carriers are thermally ionized and the resistivity is independent of the applied field. It should be noted that at applied fields greater than ~0.2 V/μm, resistivity values less than ~1 Ohm-cm indicate that substantially all carriers are ionized as a result of field ionization, even at low temperatures. In some cases, the resistivity will differ as a function of temperature because the resistivity is the product of mobility and carrier concentration and mobility is typically a function of temperature.

Figure 7B:
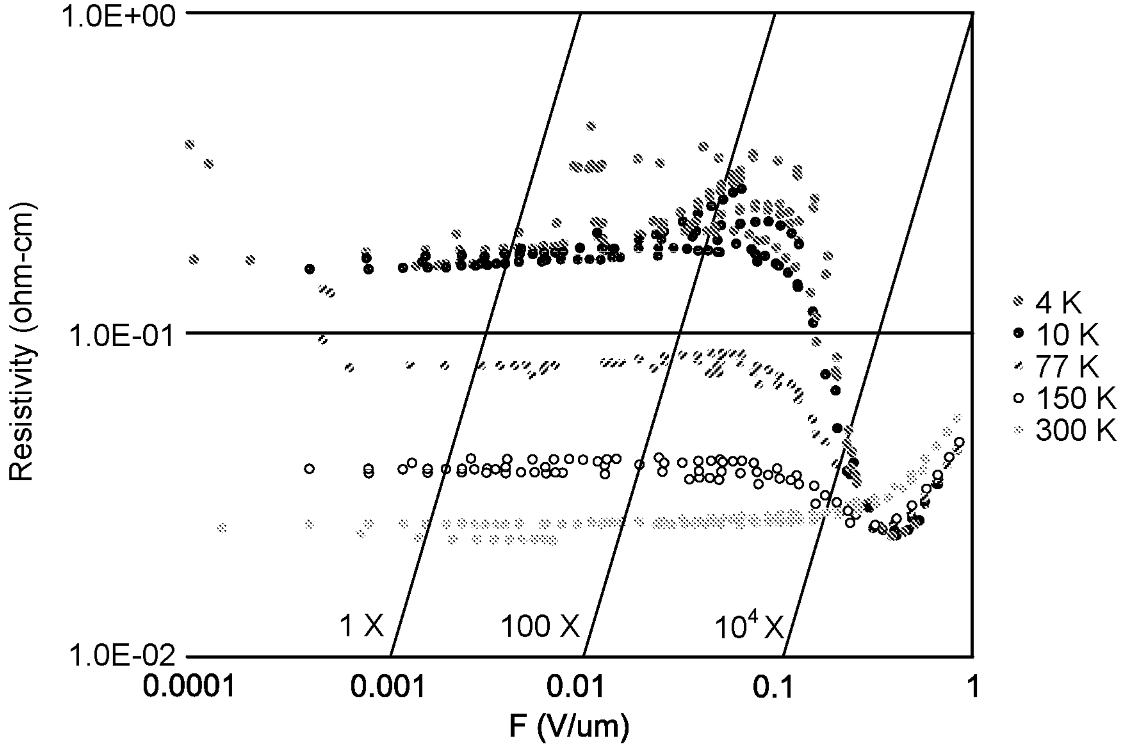
FIG. 7B is a plot illustrating resistivity vs. applied bias for a p-type cryogenic bipolar diode according to an embodiment of the present invention.

FIG. 7B is a plot illustrating resistivity vs. applied field for a p-type cryogenic bipolar diode according to an embodiment of the present invention. In a manner similar to that discussed in relation to FIG. 7A, as the applied field increases, field ionization of dopants frozen out at low temperature results in dramatic decreases in resistivity. Referring to FIG. 7B, for operation at 4 K, the resistivity is ~0.5 Ohm-cm for applied fields less than 0.1 V/μm. As the applied field increases to values greater than 0.1 V/μm, the resistivity begins to drop, decreasing to ~0.05 Ohm-cm for an applied field of ~0.5 V/μm. Thus, field ionization of carriers at 4 K can produce approximately one order of magnitude variation in resistivity for silicon doped with phosphorus at a dopant density of $9.4\times10^{17}$ $cm^{-3}$. Similarly for operation at 10 K, the resistivity is ~0.5 Ohm-cm for applied fields less than 0.1 V/μm. As the applied field increases to values greater than 0.1 V/μm, the resistivity begins to drop, decreasing to ~0.05 Ohm-cm for an applied field of ~0.5 V/μm. Thus, field ionization of carriers at 10 K can produce approximately one order of magnitude variation in resistivity. As the operating temperature increases, thermal ionization results in a decrease in resistivity such that, at 300 K, substantially all carriers are thermally ionized and the resistivity is independent of the applied field.

Comparing the data presented in FIGS. 7A and 7B, the inventor has determined that the drop in resistivity for both n-type and p-type dopants is not related to self-heating. It could be thought that as the applied field increases, current flow in the doped semiconductor region will result in Joule heating, which will result in thermal activation of the frozen out dopants.

In FIGS. 7A and 7B, contours of constant power are plotted (1×, 100×, $10^4$×), with 1× equal to 2 nW/$\mu m^2$ of heat evolved. Considering the 1× constant power contour at 4 K, the transition occurs in n-type material at approximately 2 nW/$\mu m^2$ (1× contour), whereas the transition occurs in p-type material at an applied field to the right of the 100× constant power contour. It should be noted that because the p-type material has a higher critical field (i.e., a higher activation energy), the transition is shifted to a higher constant power contour. Moreover, it should be noted that the doping levels are different for the devices measured to generate the plots in FIGS. 7A and 7B, resulting in different resistivity levels.

The thermal properties of the structures used in FIGS. 7A and 7B are essentially identical. If the resistive transition at 4K in the phosphorus doped sample of FIG. 7B was initiated due to Joule heating, then the increase in temperature at the onset of the resistive transition in the boron doped sample of FIG. 7A, where the evolved power density is 100× lower, would be approximately 100× less than at the observed onset of the resistive transition in FIG. 7B. The fact that the transition occurs at 100× lower power shows that the transition is not due to self-heating. The inventors have also noted that there is little to none of the hysteresis in the resistance that would be expected in the presence of self-heating, unless the devices are driven most of the way through the transition. Also, the onset of the transition occurs at approximately the same applied field, independent of the resistance at low applied field. In contrast with this behavior, a transition initiated by self-heating would begin at a lower applied field for devices with a lower low-field resistance because the evolved power per unit length of the doped semiconductor region scales as the field squared over the resistance/length.

Figure 8:
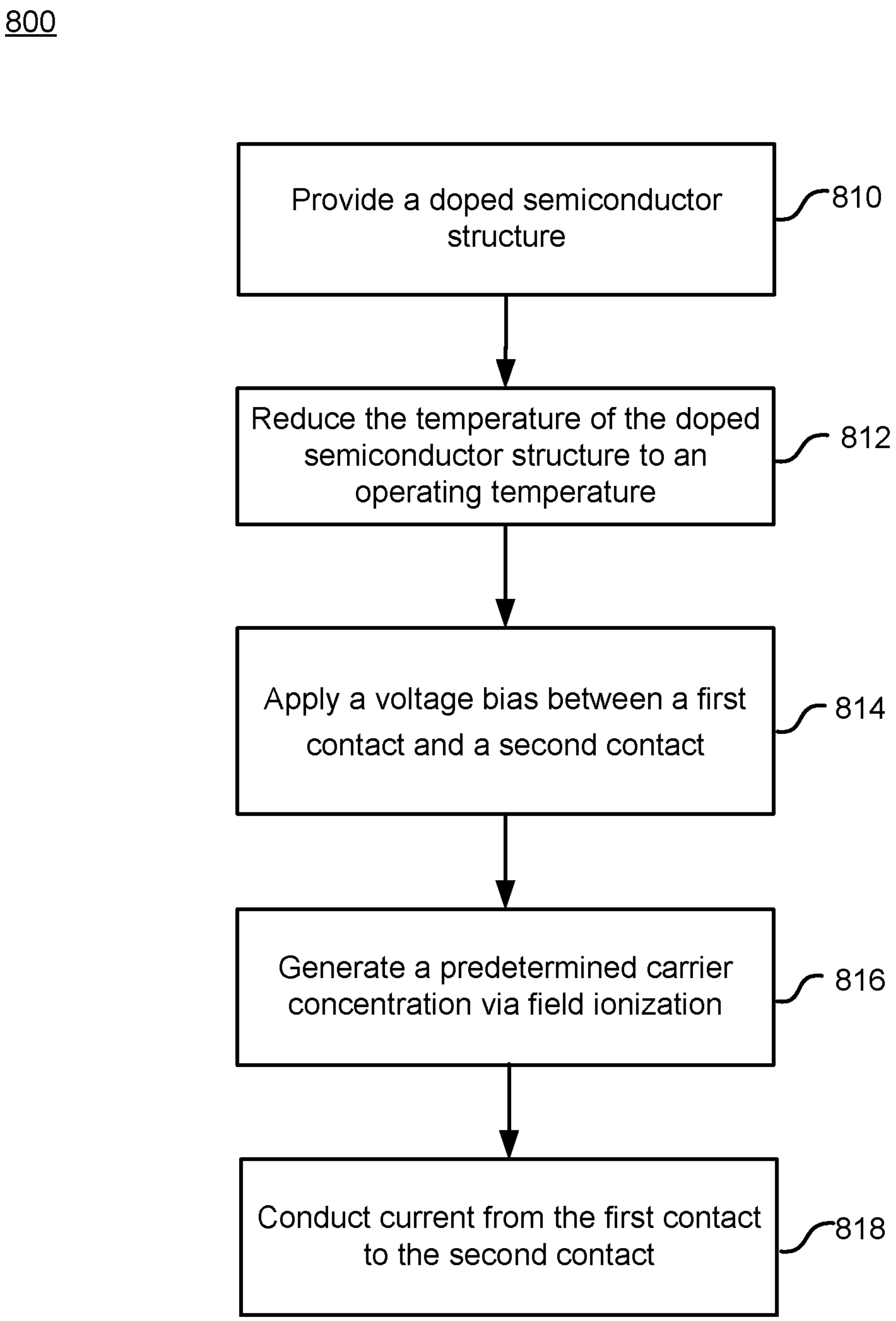
FIG. 8 is a simplified flowchart illustrating operation of a cryogenic bipolar diode according to an embodiment of the present invention.

FIG. 8 is a simplified flowchart illustrating operation of a cryogenic bipolar diode according to an embodiment of the present invention. The method 800 includes providing a doped semiconductor structure having a first contact, a second contact, and a doped semiconductor region electrically connected to the first contact and the second contact (810). The method also includes reducing the temperature of the doped semiconductor structure to an operating temperature (812). The dopant atoms in the doped semiconductor region are characterized by a doping density such that a majority of the dopant atoms freeze out at temperatures less than the operating temperature. The method further includes applying a voltage bias between the first contact and the second contact (814), generating a predefined carrier concentration in the doped semiconductor region in response to applying the bias voltage (816), and conducting current from the first contact to the second contact (818).

Figure 9:
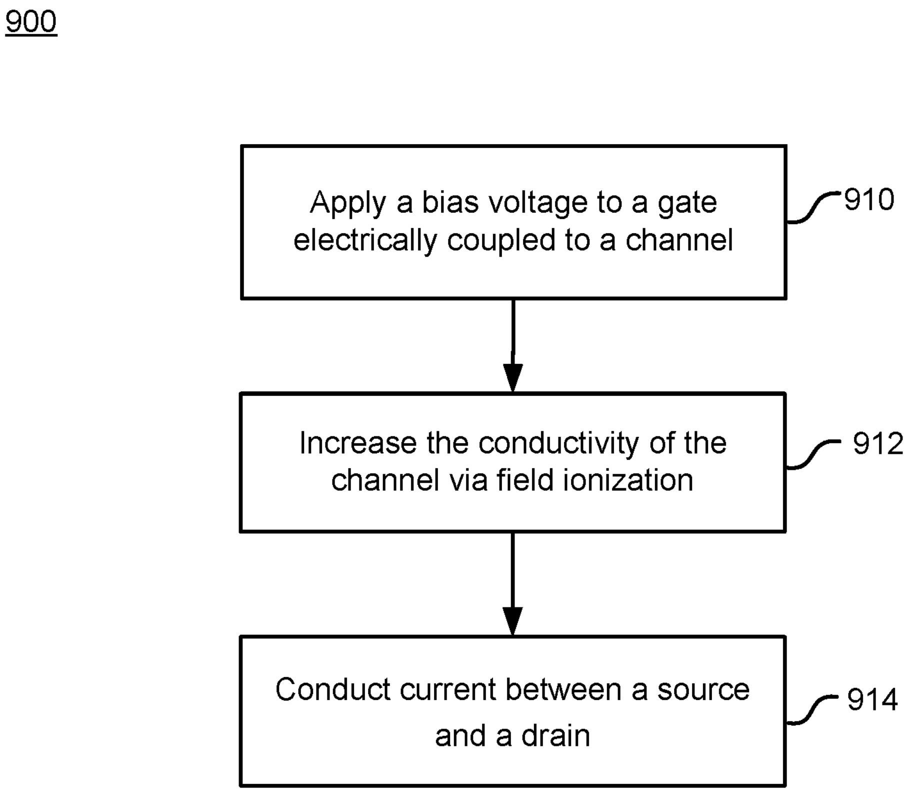
FIG. 9 is a simplified flowchart illustrating operation of a cryogenic bipolar transistor according to an embodiment of the present invention.

FIG. 9 is a simplified flowchart illustrating operation of a cryogenic bipolar transistor according to an embodiment of the present invention. The bipolar transistor, which can be operated at cryogenic temperatures, includes a source, a drain, and a channel electrically coupled to the source and the drain. The method 900 includes applying a bias voltage to a gate electrically coupled to the channel (910). As discussed herein, electrically coupled does not imply that there is a direct electrical connection (i.e., a conducting path) between the channel and the gate. The method also includes increasing a conductivity of the channel via field ionization in response to applying the bias voltage (912) and conducting current from the source to the drain (914). In alternative embodiments, rather than increasing the conductivity of a channel in response to an applied gate bias, the conductivity of the channel can be decreased in response to an applied gate bias as discussed, for example, with respect to FIG. 3A.

Figure 10:
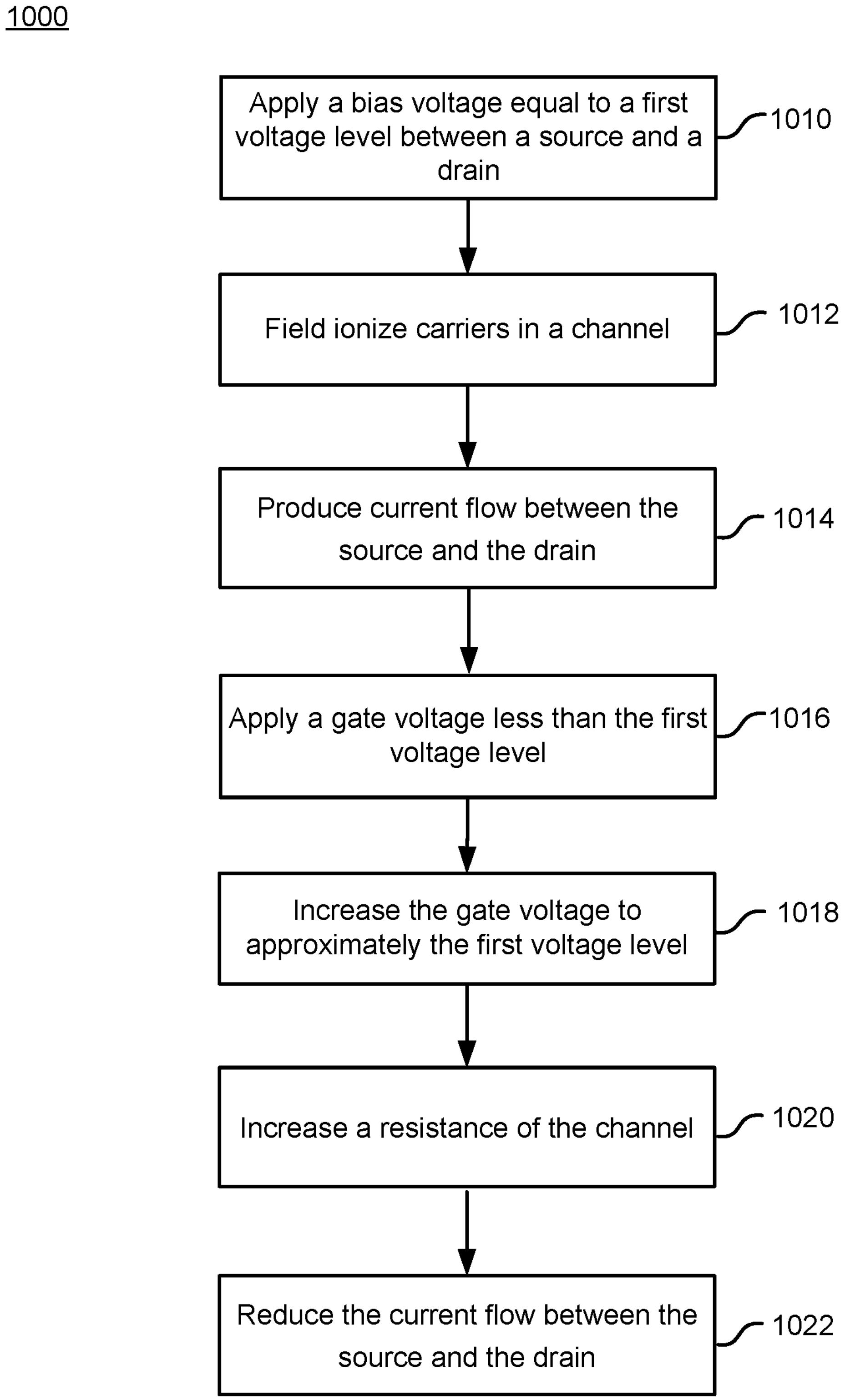
FIG. 10 is a simplified flowchart illustrating a method of operating a bipolar transistor having a source, a drain, a channel electrically coupled to the source and the drain, and a gate contact according to an embodiment of the present invention.

FIG. 10 is a simplified flowchart illustrating a method of operating a bipolar transistor having a source, a drain, a channel electrically coupled to the source and the drain, and a gate contact according to an embodiment of the present invention. The bipolar transistor can be a majority carrier device. The gate can be a non-contacting electrode.

The method includes applying a bias voltage between the source and the drain (1010). The voltage bias is equal to a first voltage level. The method also includes field ionizing carriers in the channel in response to applying the bias voltage (1012), producing current flow between the source and the drain (1014), and applying a gate voltage less than the first voltage level to the gate contact (1016). Field ionizing the carriers in the channel can include a tunneling process or a Poole-Frenkel process. The channel can be characterized by a dopant type and producing current flow can include increasing carriers corresponding to the dopant type. The current flow can result from an impact ionization process, particularly, ionization of dopants.

The method further includes increasing the gate voltage to approximately to the first voltage level (1018), increasing a resistance of the channel (1020), and reducing the current flow between the source and the drain (1022). In some embodiments, the method can also include applying a second gate voltage less than the first voltage level to a second gate contact and thereafter, increasing the second gate voltage to approximately to the first voltage level.

It should be appreciated that the specific steps illustrated in FIG. 10 provide a particular method of operating a bipolar transistor having a source, a drain, a channel electrically coupled to the source and the drain, and a gate contact according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11:
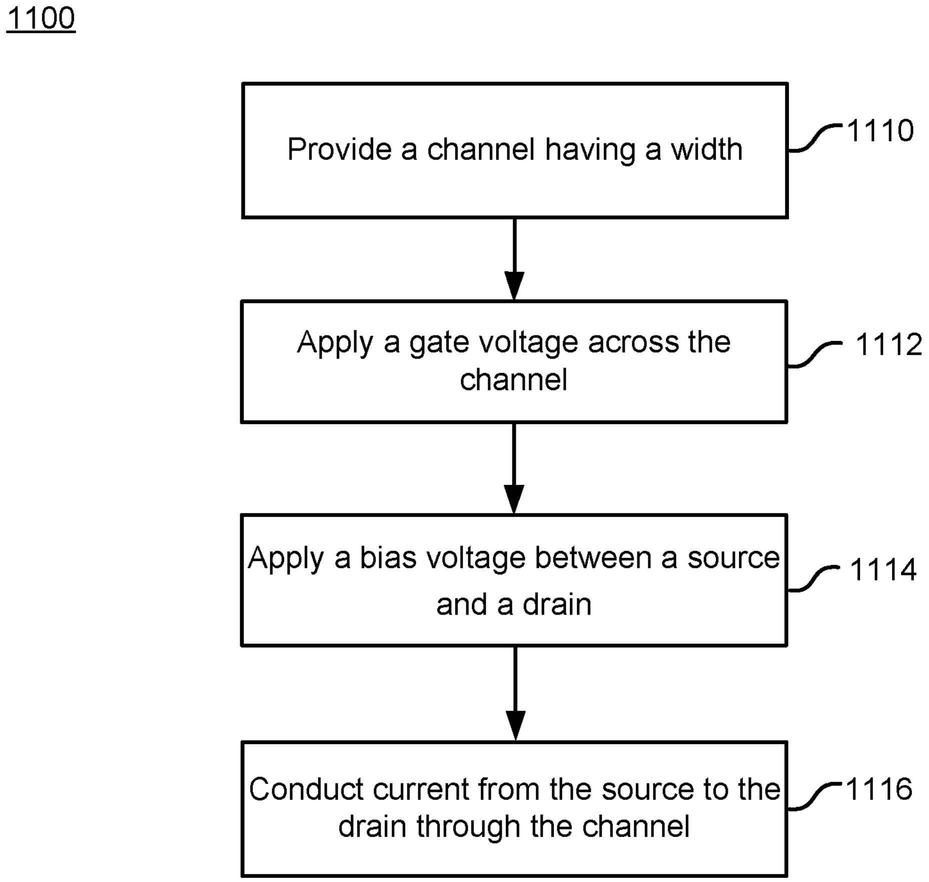
FIG. 11 is a simplified flowchart illustrating a method of operating a transistor according to an embodiment of the present invention.

FIG. 11 is a simplified flowchart illustrating a method of operating a transistor according to an embodiment of the present invention. The transistor can be a bipolar transistor operating as a majority carrier device. The method includes providing a channel having a width (1110). The channel is field ionized at a critical field. The channel can include a semiconductor material characterized by a bandgap and a potential drop across the channel can be less than the bandgap divided by the fundamental charge of an electron. As an example, the potential drop across the channel can be less than 1.12 eV divided by the fundamental charge of an electron. The method also includes applying a gate voltage across the channel (1112). The gate voltage provides a field greater than or equal to the critical field and can be applied using a non-contacting electrode. In some embodiments, the method also include, prior to applying the gate voltage, reducing a temperature of the transistor and freezing out carriers in the channel to reduce channel conductivity to less than 0.1 $(\text{ohm-cm})^{-1}$.

The method further includes applying a bias voltage between a source and a drain (1114) and conducting current from the source to the drain through the channel in response to applying the gate voltage and the bias voltage (1116). The source can be connected to the channel through an ohmic contact and the drain can be connected to the channel through an ohmic contact.

It should be appreciated that the specific steps illustrated in FIG. 11 provide a particular method of operating a transistor according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

According to an embodiment of the present invention, a bipolar diode includes a first contact, a doped semiconductor region electrically coupled to the first contact, and a second contact electrically coupled to the doped semiconductor region. The doped semiconductor region can be characterized by dopant atoms and a distribution of the dopant atoms such that a majority of the dopant atoms freeze out at temperatures less than an operating temperature. The first contact can be an anode and the second contact can be a cathode. The first contact can be a cathode and the second contact can be an anode. The doped semiconductor region can be characterized by a dopant concentration between $1\times10^{13}$ and $5\times10^{18}$ $cm^{-3}$. The first contact can be a first ohmic contact region electrically coupled to a first portion of the doped semiconductor region and the second contact can be a second ohmic contact region electrically coupled to a second portion of the doped semiconductor region.

The bipolar diode can further include a substrate supporting the bipolar diode, a cooling block thermally coupled to the substrate, and a cryostat, wherein the bipolar diode can be disposed in the cryostat. At least one of the first contact or the second contact can be a rectifying contact.

According to another embodiment of the present invention, a method of operating a bipolar diode includes providing a doped semiconductor structure having a first contact, a second contact, and a doped semiconductor region electrically connected to the first contact and the second contact and reducing a temperature of the doped semiconductor structure to an operating temperature, wherein dopant atoms in the doped semiconductor region are characterized by a doping density such that a majority of the dopant atoms freeze out at temperatures less than the operating temperature. The method also includes applying a voltage bias between the first contact and the second contact, generating a predetermined carrier concentration in the doped semiconductor region in response to applying the bias voltage, and conducting current from the first contact to the second contact. The operating temperature can be less than 77 K. The operating temperature can be less than 10 K. The operating temperature can be less than 4K.

The method can also include, prior to applying the voltage bias, applying a zero voltage bias between the first contact and the second contact. Generating the predetermined carrier concentration can include field ionizing at least a portion of dopant atoms in the doped semiconductor region. The doped semiconductor region can include dopants with an activation energy 4F and kT is less than 4E, where k is the Boltzmann constant. The method can include freezing out carriers in response to reducing the temperature. The majority of carriers can be frozen out at zero applied field. The current can be non-linear as a function of the voltage bias. An initial carrier concentration of the doped semiconductor structure at the operating temperature can be four orders of magnitude less than the predetermined carrier concentration.

The method can further include applying a second voltage bias greater than the voltage bias to the first contact, generating a second predetermined carrier concentration greater than the predetermined carrier concentration in response to applying the second voltage bias, and conducting a second current greater than the current.

According to an embodiment of the present invention, a bipolar transistor includes a first contact, a second ohmic contact, and a doped semiconductor channel electrically coupled to the first contact and the second ohmic contact. The doped semiconductor channel comprises a first longitudinal surface and an opposing second longitudinal surface. The bipolar transistor also includes a first gate contact disposed adjacent the first longitudinal surface of the doped semiconductor channel and a second gate contact disposed adjacent the second longitudinal surface of the doped semiconductor channel. The doped semiconductor channel includes dopant atoms and can be characterized by a distribution of the dopant atoms such that a majority of the dopant atoms freeze out at zero or a low applied field between the first contact and the second ohmic contact. The doped semiconductor channel includes dopant atoms and can be characterized by a distribution of the dopant atoms such that a majority of the dopant atoms are frozen out at temperatures below a critical temperature. The first contact can include a first ohmic contact. The first contact can include a rectifying contact. The first contact can include a first ohmic contact comprising a source and the second ohmic contact can be a drain.

The doped semiconductor channel can include silicon, for example, characterized by a doping level of $5\times10^{17}$ $cm^{-3}$. The doped semiconductor channel can include germanium, for example, characterized by a doping level of $1\times10^{17}$ $cm^{-3}$. The doped semiconductor channel can include a layer of material, the first longitudinal surface can include a lower surface of the layer of material, the second longitudinal surface can include an upper surface of the layer of material, the first gate contact can be disposed below the first longitudinal surface, and the second gate contact can be disposed above the second longitudinal surface. The layer of material can include a silicon layer. A thickness of the silicon layer can range from 10 nm to 500 nm, for example, from 10 nm to 100 nm.

According to another embodiment of the present invention, a majority carrier transistor includes a source contact having a first dopant type, a drain contact having the first dopant type and a doped semiconductor channel having the first dopant type and electrically coupled to the source contact and the drain contact. The doped semiconductor channel comprises a first longitudinal surface and an opposing second longitudinal surface. A first gate contact can be disposed adjacent the first longitudinal surface of the doped semiconductor channel and a second gate contact can be disposed adjacent the second longitudinal surface of the doped semiconductor channel. The first dopant type can be n-type. The first dopant type can be p-type. The majority carrier transistor can be a bipolar transistor. The doped semiconductor channel includes dopant atoms and can be characterized by a distribution of the dopant atoms such that a majority of the dopant atoms freeze out at zero or a low applied field between the source contact and the drain contact. The doped semiconductor channel includes dopant atoms and can be characterized by a distribution of the dopant atoms such that a majority of the dopant atoms are frozen out at temperatures below a critical temperature. The source contact can be an ohmic contact. The drain contact can be an ohmic contact. The doped semiconductor channel can include silicon. A thickness of the silicon layer can range from 10 nm to 500 nm, for example, from 10 nm to 100 nm. The silicon can be characterized by a doping level of $5\times10^{17}$ $cm^{-3}$. The doped semiconductor channel can include germanium, for example, characterized by a doping level of $1\times10^{17}$ $cm^{-3}$.

According to an embodiment of the present invention, an array of bipolar transistors includes a first common contact, an ohmic second common contact, and a plurality of doped semiconductor channels electrically coupled to the first common contact and the ohmic second common contact. Each of the plurality of doped semiconductor channels comprises a first longitudinal surface and an opposing second longitudinal surface. The array of bipolar transistors also includes a plurality of first gate contacts and a plurality of second gate contacts. Each of the plurality of first gate contacts can be disposed adjacent one of the plurality of first longitudinal surfaces and each of the plurality of second gate contacts can be disposed adjacent one of the plurality of second longitudinal surfaces.

Each of the plurality of doped semiconductor channels can include dopant atoms and be characterized by a distribution of the dopant atoms such that a majority of the dopant atoms freeze out at zero or a low applied field between the first contact and the second ohmic contact. Each of the plurality of doped semiconductor channels can include dopant atoms and be characterized by a distribution of the dopant atoms such that a majority of the dopant atoms are frozen out at temperatures below a critical temperature. The first common contact can be a first ohmic contact. The first common contact can be a rectifying contact. The first common contact can be a first ohmic common contact comprising a source and the second ohmic common contact can be a drain. Each of the plurality of doped semiconductor channels can include silicon.

According to an embodiment of the present invention, a method of operating a bipolar transistor having a source, a drain, and a channel electrically coupled to the source and the drain includes applying a bias voltage to a gate electrically coupled to the channel, increasing a conductivity of the channel via field ionization in response to applying the bias voltage, and conducting current from the source to the drain. The method can also include reducing the temperature of the channel to an operating temperature. Dopant atoms in the channel can be characterized by a doping distribution such that a majority of the dopant atoms freeze out at temperatures less than the operating temperature. The bipolar transistor can be a majority carrier device. The field ionization can include tunneling or a Poole-Frenkel process.

The method can also include increasing the bias voltage, increasing the conductivity of the channel, and conducting an increased current from the source to the drain. The increased current can include an impact ionization process including ionization of dopants. Reducing the temperature can result in a reduction in a conductivity of the channel in the absence of an applied field to less than 0.1 $(\text{ohm-cm})^{-1}$. The applied field can be applied by gate electrodes. The channel can be characterized by a dopant type and increasing the conductivity of the channel can include increasing carriers corresponding to the dopant type. The dopant type can be n-type and the carriers can be electrons in a conduction band. The bipolar transistor can be a majority carrier device. The gate can be a non-contacting electrode. Increasing the conductivity of the channel can include tunneling of electrons from donor dopants to the conduction band or tunneling of holes from acceptor dopants to the valence band. Increasing the conductivity of the channel can include ionization of dopants via Poole-Frenkel like excitation of electrons from the dopant to the conduction band or holes to the valence band. The channel can include a semiconductor material characterized by a bandgap and the potential drop across the channel can be less than the bandgap divided by the fundamental charge of an electron. The potential drop across the channel can be less than 1.12 eV divided by the fundamental charge of an electron. The potential drop of less than 300 mV/μm across the channel can produce a critical field for field ionization. The critical field can be less than 100 mV/μm or less than 50 mV/μm.

In another embodiment, a method of operating a bipolar transistor having a source, a drain, a channel electrically coupled to the source and the drain, and a gate contact includes applying a bias voltage between the source and the drain. The voltage bias can be equal to a first voltage level. The method also includes field ionizing carriers in the channel in response to applying the bias voltage, producing current flow between the source and the drain, applying a gate voltage less than the first voltage level to the gate contact, increasing the gate voltage to approximately to the first voltage level, increasing a resistance of the channel, and reducing the current flow between the source and the drain. The method can include applying a second gate voltage less than the first voltage level to a second gate contact and thereafter, increasing the second gate voltage to approximately the first voltage level.

The bipolar transistor can be a majority carrier device. The field ionization can include tunneling or a Poole-Frenkel process. The increased current can include an impact ionization process including ionization of dopants. The channel can be characterized by a dopant type and increasing the conductivity of the channel can include increasing carriers corresponding to the dopant type. The gate can be a non-contacting electrode.

According to a specific embodiment of the present invention, a method of operating a transistor includes providing a channel having a width and applying a gate voltage across the channel. The channel is field ionized at a critical field and the gate voltage provides a field greater than or equal to the critical field. The method also includes applying a bias voltage between a source and a drain and conducting current from the source to the drain through the channel in response to applying the gate voltage and the bias voltage. The transistor can be a bipolar transistor. The source can be connected to the channel through an ohmic contact and the drain can be connected to the channel through an ohmic contact. The method may further include prior to applying the gate voltage, reducing a temperature of the transistor and freezing out carriers in the channel to reduce channel conductivity to less than 0.1 $(\text{ohm-cm})^{-1}$. The bipolar transistor can be a majority carrier device. Applying the gate voltage can include using a non-contacting electrode. The channel can include a semiconductor material characterized by a bandgap and the potential drop across the channel can be less than the bandgap divided by the fundamental charge of an electron. For example, the potential drop across the channel can be less than 1.12 eV divided by the fundamental charge of an electron.

It should also be understood that all diagrams herein are intended as schematic. Unless specifically indicated otherwise, the drawings are not intended to imply any particular physical arrangement of the elements shown therein, or that all elements shown are necessary. Those skilled in the art with access to this disclosure will understand that elements shown in drawings or otherwise described in this disclosure can be modified or omitted and that other elements not shown or described can be added.

This disclosure provides a description of the claimed invention with reference to specific embodiments. Those skilled in the art with access to this disclosure will appreciate that the embodiments are not exhaustive of the scope of the claimed invention, which extends to all variations, modifications, and equivalents.

What is claimed is:

1. A diode comprising:

a first contact comprising a cathode;

a field ionized, doped semiconductor region electrically coupled to the first contact; and a second contact comprising an anode, wherein the second contact is electrically coupled to the field ionized, doped semiconductor region.

2. The diode of claim 1 wherein the field ionized, doped semiconductor region is characterized by dopant atoms and a distribution of the dopant atoms such that a majority of the dopant atoms freeze out at temperatures less than an operating temperature.

3. The diode of claim 1 wherein the field ionized, doped semiconductor region is characterized by a dopant concentration between $1\times10^{13}$ and $5\times10^{18}$ $cm^{-3}$.

4. The diode of claim 1 wherein the first contact includes a first ohmic contact region electrically coupled to a first portion of the field ionized, doped semiconductor region and the second contact includes a second ohmic contact region electrically coupled to a second portion of the field ionized, doped semiconductor region.

5. The diode of claim 1 further comprising:

a substrate supporting the diode;

a cooling block thermally coupled to the substrate; and a cryostat, wherein the diode is disposed in the cryostat.

6. The diode of claim 1 wherein the first contact comprises a rectifying contact.

7. The diode of claim 1 wherein the field ionized, doped semiconductor region comprises silicon doped with boron, phosphorus, arsenic, antimony, or gallium.

8. The diode of claim 1 further comprising:

a substrate supporting the diode;

a cooling block thermally coupled to the substrate; and a cryostat disposed around the diode.

9. The diode of claim 1 wherein the field ionized, doped semiconductor region is characterized by dopant atoms characterized by an activation energy such that kT is less than the activation energy at an operating temperature.

10. The diode of claim 1 wherein the field ionized, doped semiconductor region is configured such that an initial carrier concentration at an operating temperature is at least four orders of magnitude less than a carrier concentration generated by field ionization.

11. The diode of claim 1 wherein a resistance per unit length of the field ionized, doped semiconductor region changes by at least seven orders of magnitude as a function of applied electric field.

12. The diode of claim 1 further comprises two outer contacts for applying a voltage bias and two inner measurement electrodes for measuring the applied voltage bias.

* * * * *